(12) United States Patent
Vuillermet et al.

(10) Patent No.: US 12,292,280 B2
(45) Date of Patent: May 6, 2025

(54) ANGLE SENSOR

(71) Applicant: Allegro MicroSystems, LLC, Manchester, NH (US)

(72) Inventors: Yannick Vuillermet, Voglans (FR); Xavier Blanc, Annecy (FR); Andreas P. Friedrich, Metz-Tessy (FR)

(73) Assignee: Allegro MicroSystems, LLC, Manchester, NH (US)

( * ) Notice: Subject to any disclaimer, the term of this patent is extended or adjusted under 35 U.S.C. 154(b) by 302 days.

(21) Appl. No.: 18/068,796

(22) Filed: Dec. 20, 2022

(65) Prior Publication Data

US 2024/0200926 A1 Jun. 20, 2024

(51) Int. Cl.
*G01B 7/30* (2006.01)
*G01R 33/00* (2006.01)
*G01R 33/02* (2006.01)

(52) U.S. Cl.
CPC ........... *G01B 7/30* (2013.01); *G01R 33/0005* (2013.01); *G01R 33/02* (2013.01)

(58) Field of Classification Search
CPC ...... G01B 7/30; G01R 33/0005; G01R 33/02; G01R 33/00; G01D 5/145; G01D 5/147
See application file for complete search history.

(56) References Cited

U.S. PATENT DOCUMENTS

| | | | |
|---|---|---|---|
| 11,448,713 B1 | 9/2022 | Ostermann et al. | |
| 2012/0232839 A1* | 9/2012 | Ueda | G01D 5/2451 702/151 |
| 2015/0137797 A1* | 5/2015 | Ausserlechner | G01D 3/08 324/207.13 |
| 2020/0309871 A1* | 10/2020 | Watanabe | B60L 3/0038 |

OTHER PUBLICATIONS

U.S. Appl. No. 17/651,265, filed Feb. 16, 2022, Ostermann, et al.

* cited by examiner

*Primary Examiner* — Alesa Allgood
*Assistant Examiner* — Courtney G McDonnough
(74) *Attorney, Agent, or Firm* — Daly, Crowley, Mofford & Durkee, LLP

(57) ABSTRACT

A method comprising: generating signals $S_{A1}$ and $S_{B1}$ by using a first sensor that is positioned at a first position relative to a rotating target, the signals $S_{A1}$ and $S_{B1}$ being generated in response to a magnetic field that is associated with the rotating target; generating signals $S_{A2}$ and $S_{B2}$ by using a second sensor that is positioned at a second position relative to the rotating target; and calculating a position of the rotating target based on a ratio of a first difference between the signals $S_{A1}$ and $S_{A2}$ and a second difference between the signals $S_{B1}$ and $S_{B2}$.

27 Claims, 20 Drawing Sheets

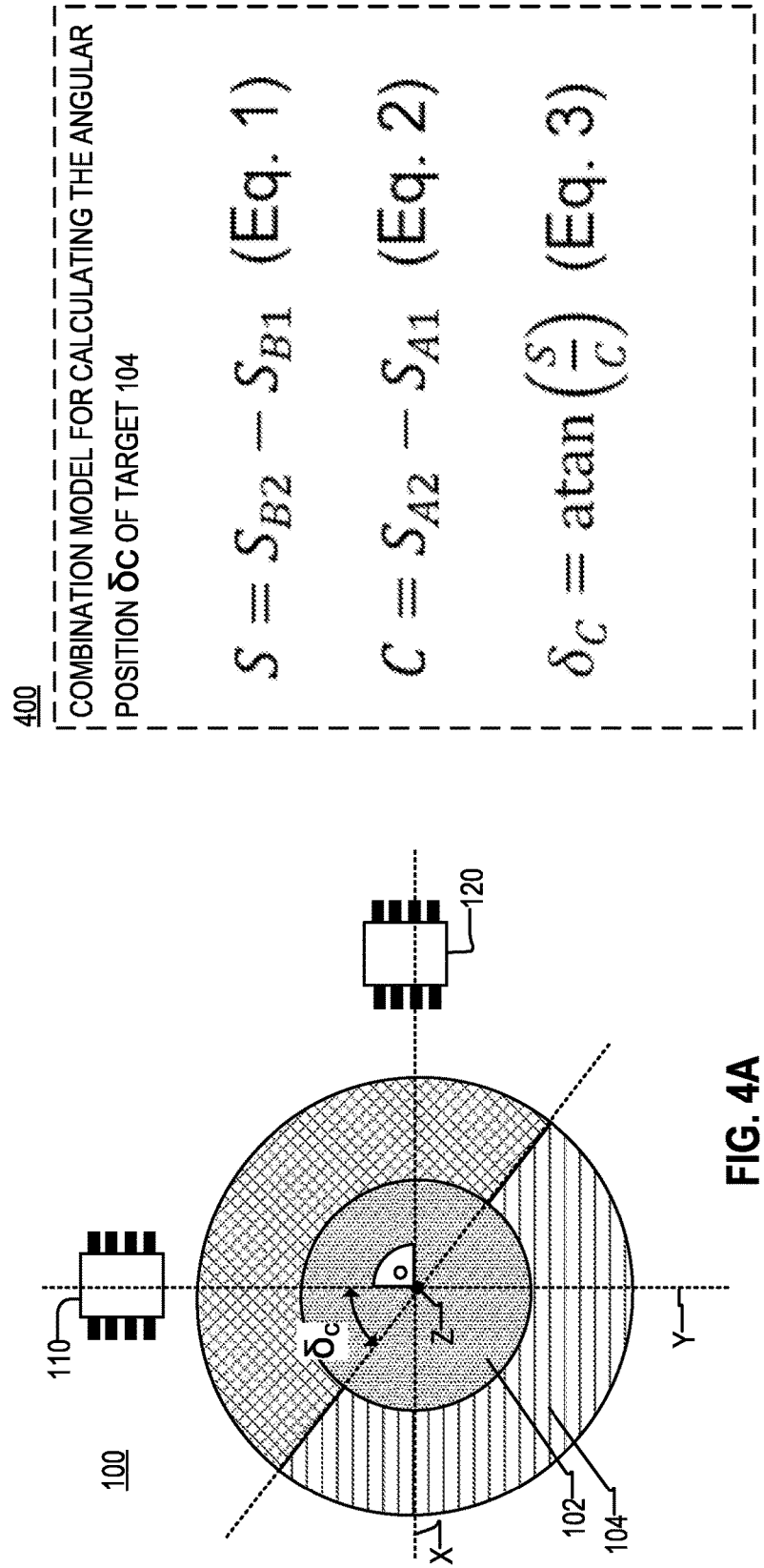

COMBINATION MODEL FOR CALCULATING THE ANGULAR POSITION $\delta_C$ OF TARGET 104

$$S = S_{B2} - S_{B1} \quad (Eq. 1)$$

$$C = S_{A2} - S_{A1} \quad (Eq. 2)$$

$$\delta_C = \operatorname{atan}\left(\frac{S}{C}\right) \quad (Eq. 3)$$

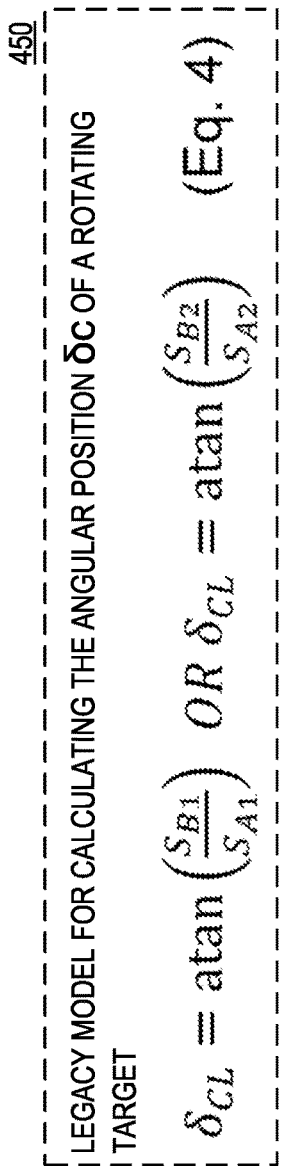

LEGACY MODEL FOR CALCULATING THE ANGULAR POSITION $\delta_C$ OF A ROTATING TARGET $$\delta_{CL} = \operatorname{atan}\left(\frac{S_{B1}}{S_{A1}}\right) \ OR \ \delta_{CL} = \operatorname{atan}\left(\frac{S_{B2}}{S_{A2}}\right) \quad (Eq. 4)$$

FIG. 4C (prior art)

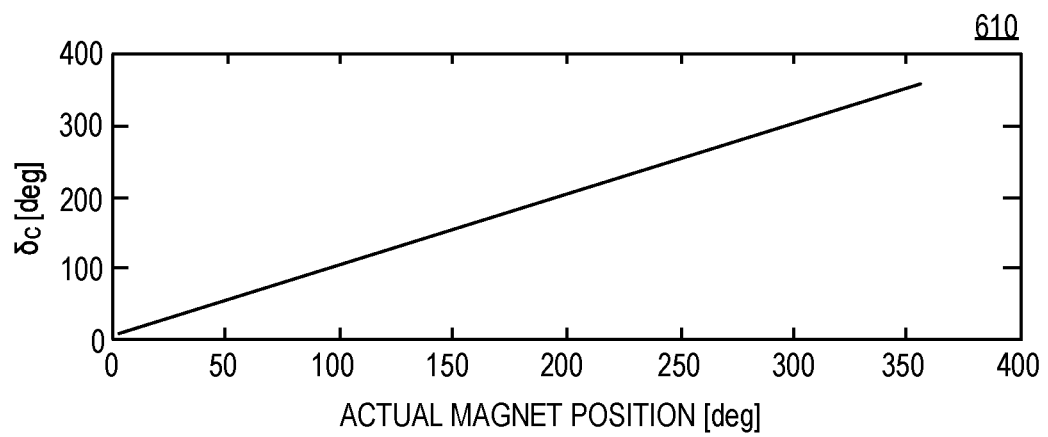
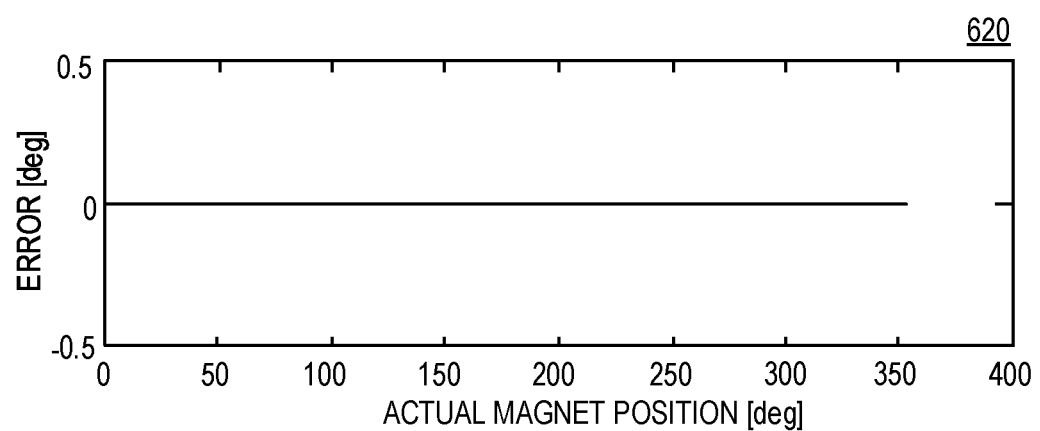
FIG. 6

ANGLE SENSOR

BACKGROUND

Magnetic field sensors including a magnetic field sensing element, or transducer, such as a Hall Effect element or a magnetoresistive element, are used in a variety of applications to detect aspects of movement of a ferromagnetic article, or target, such as proximity, speed, and direction. Applications using these sensors include, but are not limited to, a magnetic switch or "proximity detector" that senses the proximity of a ferromagnetic article, a proximity detector that senses passing ferromagnetic articles (for example, magnetic domains of a ring magnet or gear teeth), a magnetic field sensor that senses a magnetic field density of a magnetic field, and a current sensor that senses a magnetic field generated by a current flowing in a current conductor. Magnetic field sensors are widely used in automobile control systems, for example, to detect ignition timing from a position of an engine crankshaft and/or camshaft, and to detect a position and/or rotation of an automobile wheel for anti-lock braking systems.

SUMMARY

This Summary is provided to introduce a selection of concepts in a simplified form that are further described below in the Detailed Description. This Summary is not intended to identify key features or essential features of the claimed subject matter, nor is it intended to be used to limit the scope of the claimed subject matter.

According to aspects of the disclosure, a system is provided, comprising: a first sensor including a sensing element $SE_{A1}$ and a sensing element $SE_{B1}$, the sensing elements $SE_{A1}$ and $SE_{B1}$ having respective axes of sensitivity that are substantially perpendicular to each other, the sensing element $SE_{A1}$ being arranged to generate a signal $S_{A1}$, the sensing element $SE_{B1}$ being arranged to generate a signal $S_{B1}$, the signals $S_{A1}$ and $S_{B1}$ being generated in response to a magnetic field that is associated with a rotating target; a second sensor including a sensing element $SE_{A2}$ and a sensing element $SE_{B2}$, the sensing elements $SE_{A2}$ and $SE_{B2}$ having respective axes of sensitivity that are substantially perpendicular to each other, the sensing element $SE_{A2}$ being arranged to generate a signal $S_{A2}$, the sensing element $SE_{B2}$ being arranged to generate a signal $S_{B2}$, the signals $S_{A2}$ and $S_{B2}$ being generated in response to the magnetic field; and a controller configured to obtain a position of the rotating target, the position being calculated based on a first difference between the signals $S_{A1}$ and $S_{A2}$ and a second difference between the signals $S_{B1}$ and $S_{B2}$, wherein the first sensor is aligned with a first axis that intersects an axis of rotation of the rotating target, and the second sensor is aligned with a second axis that intersects the axis of rotation of the rotating target, the second axis being arranged at an angle relative to the first axis, wherein the first axis is substantially perpendicular to the second axis, respective axes of sensitivity of sensing elements $SE_{A1}$ and $SE_{A2}$ have substantially the same orientation, and the respective axes of sensitivity of sensing elements $SE_{B1}$ and $SE_{B2}$ have substantially the same orientation.

According to aspects of the disclosure, a method is provided, comprising: generating signals $S_{A1}$ and $S_{B1}$ by using a first sensor that is positioned at a first position relative to a rotating target, the signals $S_{A1}$ and $S_{B1}$ being generated in response to a magnetic field that is associated with the rotating target, the signal $S_{A1}$ being indicative of a magnitude, at the first position, of a component of the magnetic field in a first direction, and the signal $S_{B1}$ being indicative of a magnitude, at the first position, of a component of the magnetic field in a second direction, the second direction being substantially perpendicular to the first direction; generating signals $S_{A2}$ and $S_{B2}$ by using a second sensor that is positioned at a second position relative to the rotating target, the signals $S_{A2}$ and $S_{B2}$ being generated in response to the magnetic field, the signal $S_{A2}$ being indicative of a magnitude, at the second position, of the component of the magnetic field in the first direction, and the signal $S_{B2}$ being indicative of a magnitude, at the second position, of the component of the magnetic field in the second direction; calculating a position of the rotating target based on a ratio of a first difference between the signals $S_{A1}$ and $S_{A2}$ and a second difference between the signals $S_{B1}$ and $S_{B2}$.

According to aspects of the disclosure, a system is provided, comprising: means for generating signals $S_{A1}$ and $S_{B1}$ by using a first sensor that is positioned at a first position relative to a rotating target, the signals $S_{A1}$ and $S_{B1}$ being generated in response to a magnetic field that is associated with the rotating target, the signal $S_{A1}$ being indicative of a magnitude, at the first position, of a component of the magnetic field in a first direction, and the signal $S_{B1}$ being indicative of a magnitude, at the first position, of a component of the magnetic field in a second direction, the second direction being substantially perpendicular to the first direction; means for generating signals $S_{A2}$ and $S_{B2}$ by using a second sensor that is positioned at a second position relative to the rotating target, the signals $S_{A2}$ and $S_{B2}$ being generated in response to the magnetic field, the signal $S_{A2}$ being indicative of a magnitude, at the second position, of the component of the magnetic field in the first direction, and the signal $S_{B2}$ being indicative of a magnitude, at the second position, of the component of the magnetic field in the second direction; calculating a position of the rotating target based on a ratio of a first difference between the signals $S_{A1}$ and $S_{A2}$ and a second difference between the signals $S_{B1}$ and $S_{B2}$.

BRIEF DESCRIPTION OF THE DRAWING FIGURES

Other aspects, features, and advantages of the claimed invention will become more fully apparent from the following detailed description, the appended claims, and the accompanying drawings in which like reference numerals identify similar or identical elements. Reference numerals that are introduced in the specification in association with a drawing figure may be repeated in one or more subsequent figures without additional description in the specification in order to provide context for other features.

FIG. 4A is a diagram of an example of a system, according to aspects of the disclosure;

FIG. 4B is a diagram of an example of a model for calculating the position of a target, according to aspects of the disclosure;

FIG. 4C is a diagram of an example of a model for calculating the position of a target, according to the prior art;

FIG. 6 shows plots illustrating aspects of the operation of a system, according to aspects of the disclosure;

DETAILED DESCRIPTION

Figure 1C:
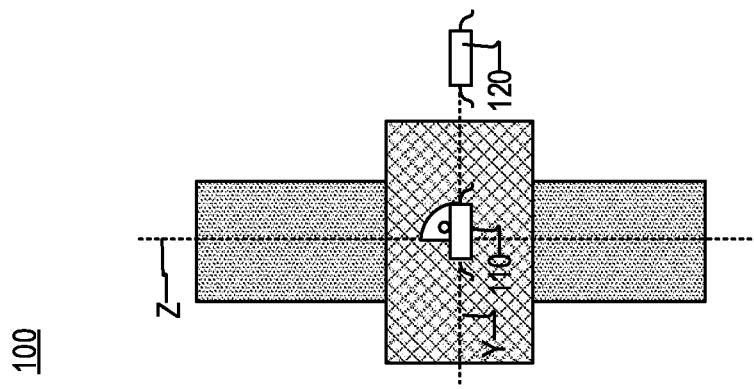
FIG. 1C is a side view of the system of FIG. 1A, according to aspects of the disclosure.
Figure 1B:
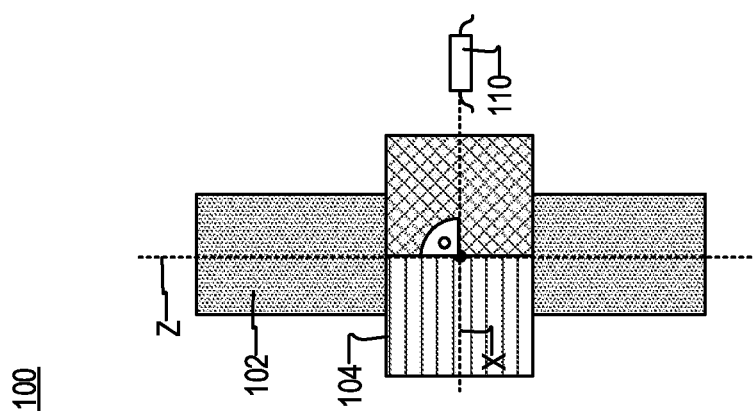
FIG. 1B is a side view of the system of FIG. 1A, according to aspects of the disclosure.
Figure 1A:
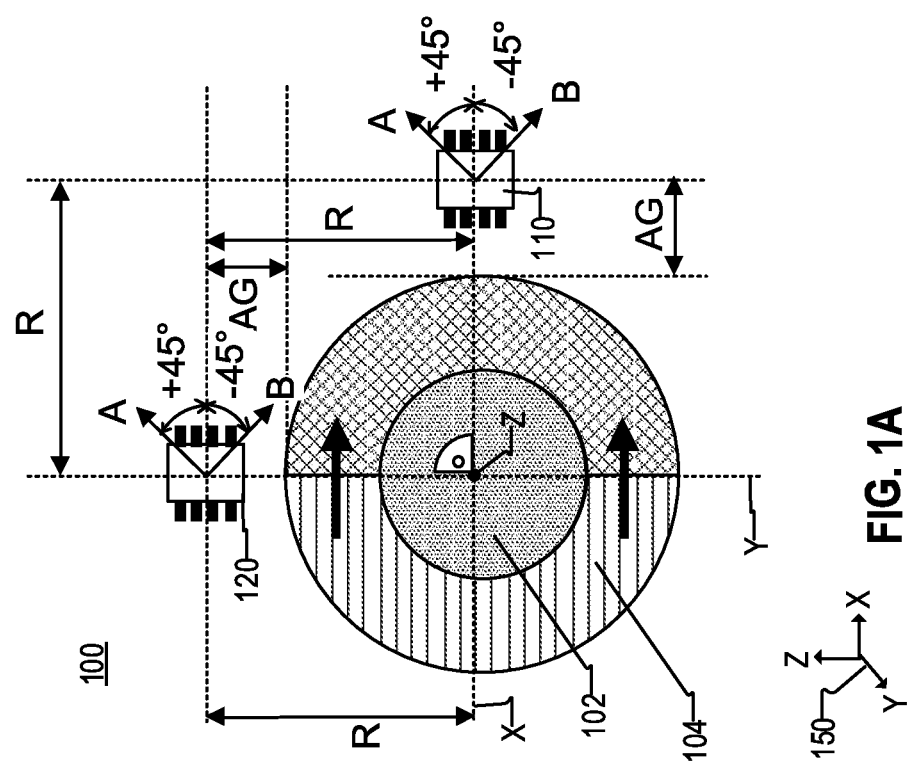
FIG. 1A is a top-down view of an example of a system, according to aspects of the disclosure.

FIGS. 1A-C show an example of a system 100, according to aspects of the disclosure. As illustrated, the system 100 includes a di-pole ring magnet 104 that is coupled to a rotating shaft 102. Magnet 104 may have diametrical uniform magnetization, and it may have two poles. Magnet 104 may be arranged to rotate with the rotating shaft 102. Sensors 110 and 120 may be magnetic field sensors that are used to detect the magnetic field that is produced by the magnet 104. As is discussed further below, sensors 110 and 120 may be used to measure the position of the magnet 104 and/or the shaft 102.

In the example of FIGS. 1A-C, sensor 120 is aligned with the Y-axis of a coordinate system 150 and sensor 110 is aligned with the X-axis of coordinate system 150, while the shaft 102 and magnet 104 are configured to rotate about the Z-axis of coordinate system 150. The distance between sensor 110 and the axis of rotation of magnet 104 (i.e., the Z-axis) may be R. and the distance between sensor 120 and the axis of rotation of the magnet may also be R. An air gap AG may exist between sensor 110 and the magnet 104, and the same air gap AG may exist between sensor 120 and the magnet 104. Although in the example of FIGS. 1A-C the magnet 104 is a di-pole magnet, alternative implementations are possible in which the magnet 104 is a multi-pole magnet. Although in the example of FIGS. 1A-C the magnet 104 and/or shaft 102 are arranged to perform full revolutions, alternative implementations are possible in which the magnet 104 and/or the shaft 102 are configured to perform a reciprocal motion about the Z-axis. For example, the shaft 102 and/or magnet 104 may be configured to rotate 45 degrees in one direction and then 45 degrees in the opposite direction.

Figure 1D:
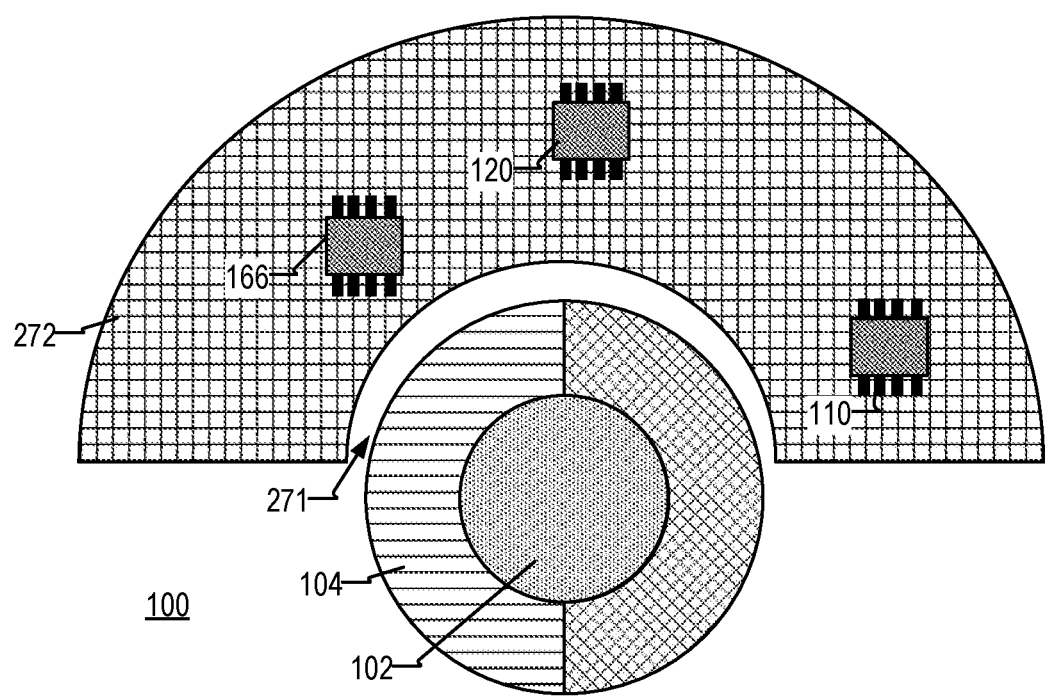
FIG. 1D is a diagram of the system of FIG. 1A, according to aspects of the disclosure.

FIG. 1D shows the implementation of the system 100, which is shown in FIGS. 1A-C, in further detail. As illustrated, the system 100 may further include a controller 166. The controller may include any suitable type of processing circuitry that is configured to receive and/or process signals that are generated by sensors 110 and 120. In some implementations, the controller 166 may include a relatively simple digital logic (and/or electronic circuitry) for evaluating equations 1-3 (shown in FIG. 4B). Additionally or alternatively, the controller 166 may include a general-purpose processor, a special-purpose processor, a signal processor, and/or any other suitable type of processing circuit. The controller 166 may be the same or similar to each of the controllers 720, 820, 920, 1020, 1120, and 1220, which are discussed further below, and each of the controllers 720, 820, 920, 1020, 1120, and 1220 may be the same or similar to the controller 166.

Although in the example of FIG. 1D the controller 166 is separate from sensors 110 and 120, in some implementations, the controller 166 may be integrated into one of sensors 110 and 120. In the latter case, the controller 166 may be part of the processing circuitry of the sensor in which the controller 166 is integrated, and it may share registers and/or logic in common with that circuitry. For example, in instances where the controller 166 is integrated into the sensor 110, the processing circuitry 308 (shown in FIG. 3A), may include a portion of a processing block that is configured to perform one or more of step 906, of process 900 (shown in FIG. 9B), steps 1006 and 1010 of process 1000 (shown in FIG. 10B), and step 106 of process 1200 (shown in FIG. 12). And the controller 166 may include another portion of the processing block that is configured to perform one or more of steps 910-916 of the process 900, steps 1014-1017 of process 1000, step 1110 of the process 1100 (shown in FIG. 11B), and steps 1210-1218 of process 1200. The sensor in which the controller 166 is integrated may be referred to as a master sensor, and the other one may be referred to as a slave sensor. In addition to performing the same activities as the slave sensor, the master sensor may also perform actions that include comparing input from the slave sensor to determine if it agrees with calculations performed by the master sensor, generating a fault signal, generating an output signal based on the position of target 104, etc.

Although in the example of FIG. 1D the controller 166 is provided on the same PCB 272 with the sensors 110 and 120, alternative implementations are possible in which the controller 166 is provided separately of the PCB 272. In such implementations, the controller 166 may be part of a motor control unit (MCU) that is arranged to control the speed and/or torque of an electrical motor (not shown) that is arranged to turn the shaft 102.

In one aspect, FIG. 1D illustrates that, in some implementations, each of the controller 166, sensor 110, and sensor 120 may be implemented as a separate integrated circuit (e.g., as a separate chip or a separate integrated circuity package). In another aspect, FIG. 1D illustrates that the controller 166, sensor 110, and sensor 120 may be mounted on a printed circuit board (PCB) 272 that includes a cutout 271, and which is configured to be positioned on the side of the magnet 104, as shown. In some implementations, the PCB 272 may include one or more conductive traces that are used to implement communications channels between sensors 110 and 120, between sensor 110 and the controller 166 and/or between sensor 120 and the controller 166. The conductive traces may be used to implement a data bus or direct lines of communication. Stated succinctly, the present disclosure is not limited to any specific method for coupling sensors 110 and 120, and controller 166, to one another.

Figure 2C:
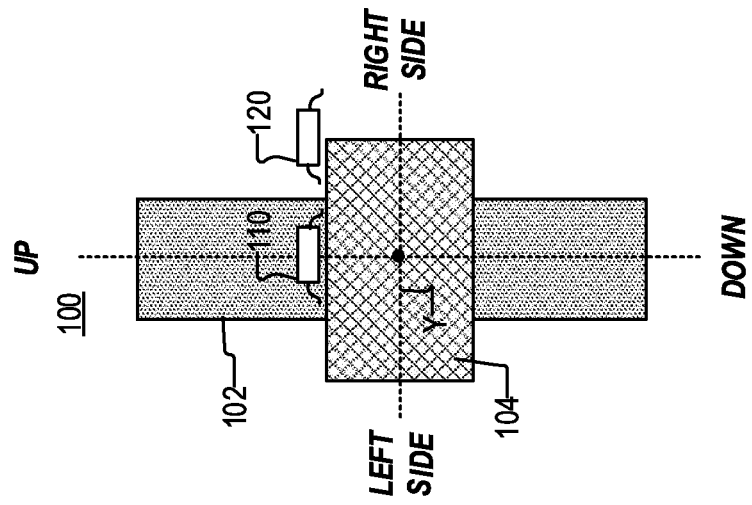
FIG. 2C is a side view of the system of FIG. 2A, according to aspects of the disclosure.
Figure 2B:
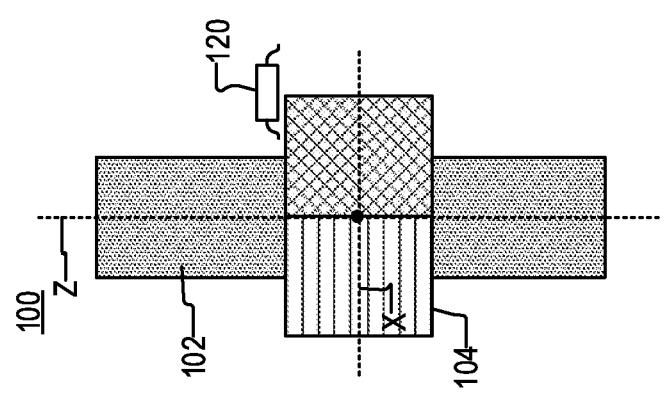
FIG. 2B is a side view of the system of FIG. 2A, according to aspects of the disclosure.
Figure 2A:
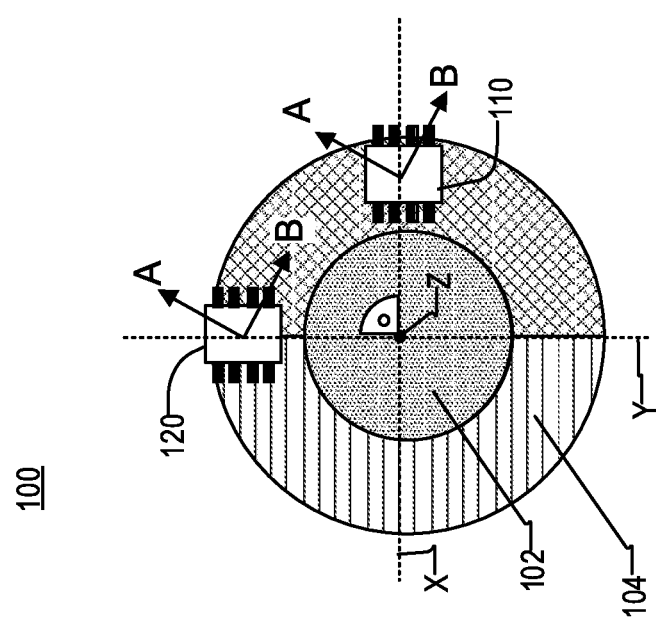
FIG. 2A is a top-down view of an example of a system, according to aspects of the disclosure.

FIGS. 2A-C show an example of another implementation of the system 100, according to aspects of the disclosure. In the example of FIGS. 2A-C, sensors 110 and 120 are disposed directly above the magnet 104. FIG. 2A-C is provided to illustrate that the techniques described throughout the disclosure also work when the sensors 110 and 120 are disposed above or below magnet 104.

Under the nomenclature of the present disclosure, the magnet 104 is also referred to as a "target". Although in the present example, the magnet 104 is used is a target, alternative implementations are possible in which another type of target is used such as a puck magnet, the shaft 102 itself (if the shaft is itself magnetic or illuminated by a back-bias magnet), or another metal object that is coupled to shaft. Under the nomenclature of the present disclosure, a sensor is considered to be above or below the magnet 104 if the sensor is displaced from the magnet 104 along the axis of rotation of the magnet 104 (e.g., the Z-axis of the coordinate system 150). Under the nomenclature of the present disclosure, a sensor is considered to be to the side of the magnet 104 if the sensor is displaced from the magnet 104 in a direction that is perpendicular to the axis of rotation (e.g., the X and Y axes of the coordinate system 150). Under the nomenclature of the present disclosure, a sensor is considered to be situated directly above or below the magnet 104 if at least a portion of the sensor is situated directly above or below the magnet 104. Under the nomenclature of the present disclosure, a sensor is considered to be aligned with an axis if the sensor is situated on, directly above, or directly below the axis. Although in the example of FIGS. 1A-2C, the sensors 110 and 120 are aligned with axes that are perpendicular to each other, i.e., the X-axis and the Y-axis of the coordinate system 150, alternative implementations are possible in which the sensors 110 and 120 are aligned with axes that are arranged at a different angle relative to each other (e.g., an 80-degree angle, etc.). In the example of FIGS. 1A-D, the Z-axis of coordinate system 150 is perpendicular to the X and Y axes of the coordinate system 150, but the disclosure is not limited thereto.

Figure 2D:
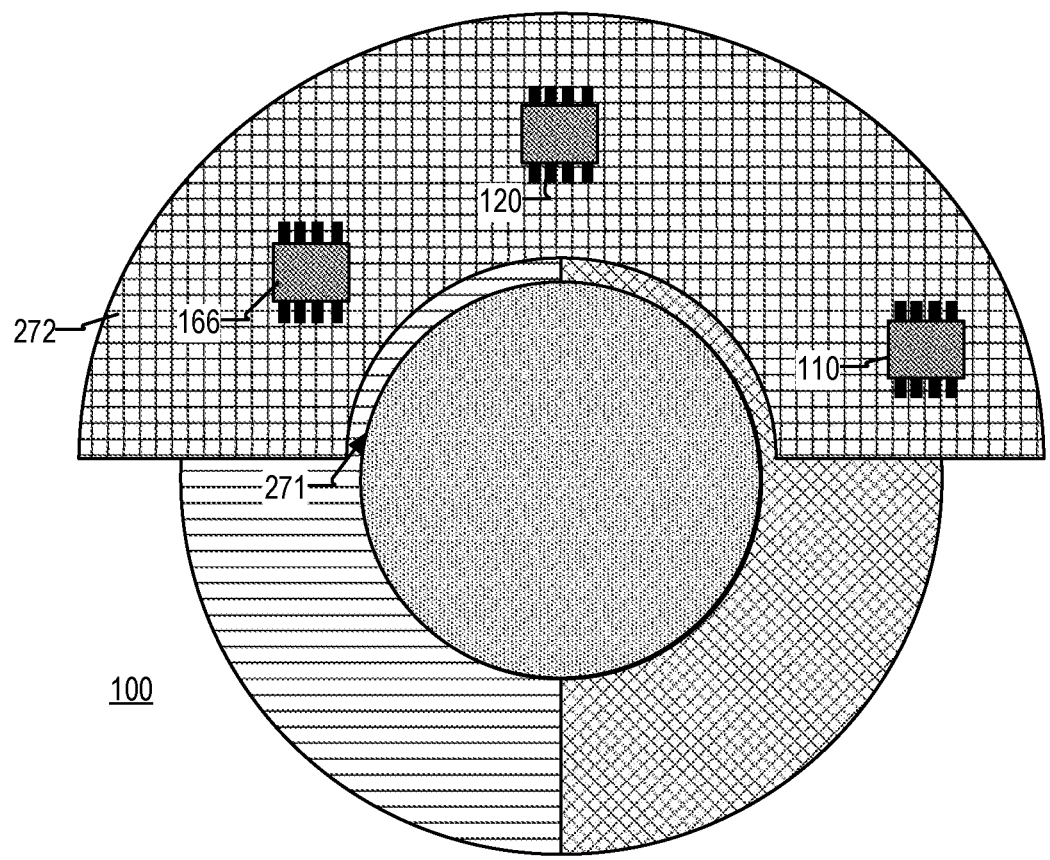
FIG. 2D is a diagram of the system of FIG. 2A, according to aspects of the disclosure.

FIG. 2D illustrates in further detail the implementation of system 100 which is shown in FIGS. 2A-C. In the example of FIG. 2D, the PCB 272 is disposed above the magnet 104. In one aspect, FIG. 2D is provided to illustrate that positioning sensors 110 and 120 above or below the magnet 104 may result in a reduced footprint of the PCB 272, which could be advantageous in applications where space is limited. Although in the example of FIG. 2D both sensors are situated above the magnet 104, alternative implementations are possible in which one of sensors 110 and 120 is situated above the magnet 104 and the other one is situated below the magnet 104.

Figure 3A:
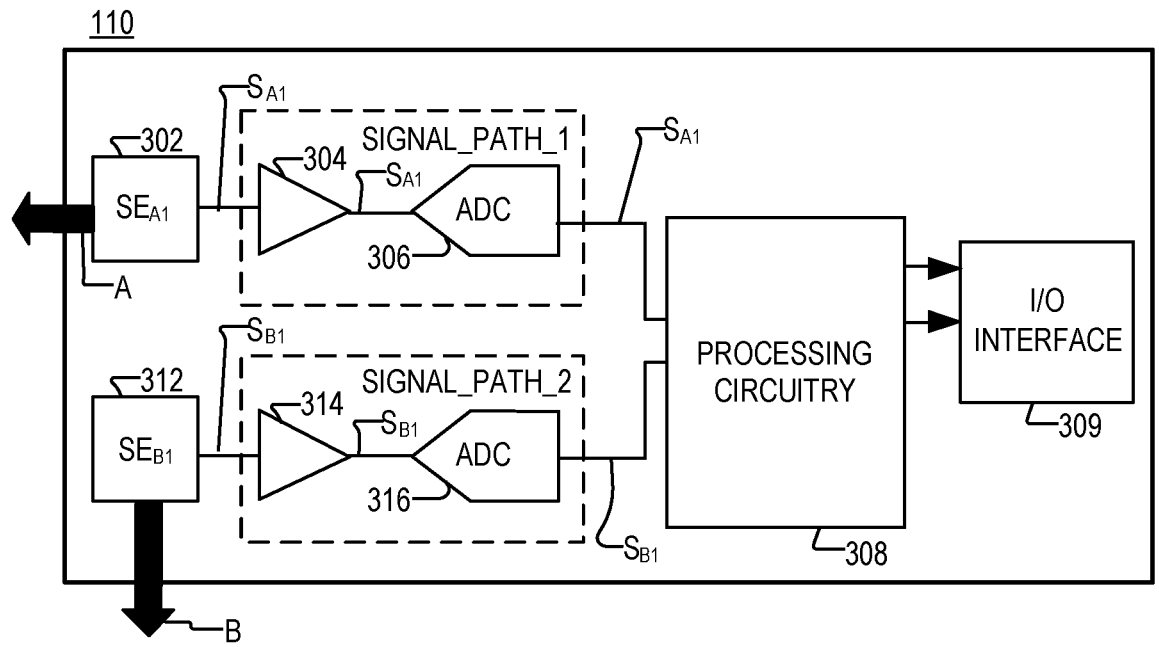
FIG. 3A is a circuit diagram of a magnetic field sensor, according to aspects of the disclosure.

FIG. 3A shows the sensor 110 in further detail. As illustrated, sensor 110 may include a magnetic field sensing element 302, a magnetic field sensing element 312, an amplifier 304, an analog-to-digital converter (ADC) 306, an amplifier 314, an ADC 316, a processing circuitry 308, and an output interface 309. The processing circuitry 308 may include any suitable type of processing circuitry. In some implementations, the processing circuitry 308 may include a CORDIC processor, an arithmetic-and-logic unit (ALU), a general-purpose processor, a special-purpose processor, a signal processor, and/or any other suitable type of processor. The output interface 309 may include any suitable type of interface for outputting signals or data from sensor 110. Although not shown, the processing circuitry 308 may include any suitable type of volatile or non-volatile memory. By way of example, the I/O interface 309 may include any suitable type of analog or digital interface. In some implementations, the I/O interface 309 may include a controller area network (CAN) bus interface, an I$^2$C interface, or a Serial Peripheral Interface (SPI).

Each of the sensing elements 302 and 312 may include one or more of a planar Hall element, a vertical Hall element, a Circular Vertical Hall (CVH) element, an Indium Antimonide (InSb) element, a giant magnetoresistance (GMR) element, an anisotropic magnetoresistance element (AMR), a tunneling magnetoresistance (TMR) element, a magnetic tunnel junction (MTJ), a fluxgate, and/or a spin-valve. The sensing element 302 may have an axis of maximum sensitivity A, and the sensing element 322 may have an axis of maximum sensitivity B. The axis of maximum sensitivity A may be substantially perpendicular to the axis of maximum sensitivity B.

In operation, the sensing element 302 may generate a signal $S_{A1}$ in response to a magnetic field that is produced by magnet 104, and provide the signal $S_{A1}$ to the amplifier 304. The amplifier 304 may amplify the signal $S_{A1}$ and provide the amplified signal $S_{A1}$ to the ADC 306. The ADC 306 may digitize the signal $S_{A1}$ and provide the digitized signal $S_{A1}$ to the processing circuitry 308. The sensing element 312 may generate a signal $S_{B1}$ in response to a magnetic field that is produced by magnet 104, and provide the signal $S_{B1}$ to the amplifier 314. The amplifier 314 may amplify the signal $S_{B1}$ and provide the amplified signal $S_{B1}$ to the ADC 316. The ADC 316 may digitize the signal $S_{B1}$ and provide the digitized signal $S_{B1}$ to the processing circuitry 308. In some implementations, the processing circuitry 308 may perform any suitable type of adjustment on the signals $S_{A1}$ and $S_{B1}$, such as temperature compensation or stress compensation. Additionally or alternatively, the processing circuitry 308 may either forward the signals $S_{A1}$ and $S_{A2}$ to an external sensor or device or process the signals $S_{A1}$ and $S_{B1}$ further. In some implementations, the processing circuitry 308 may be configured to perform any of the actions that are discussed further below with respect to FIGS. 7A-13.

Figure 3B:
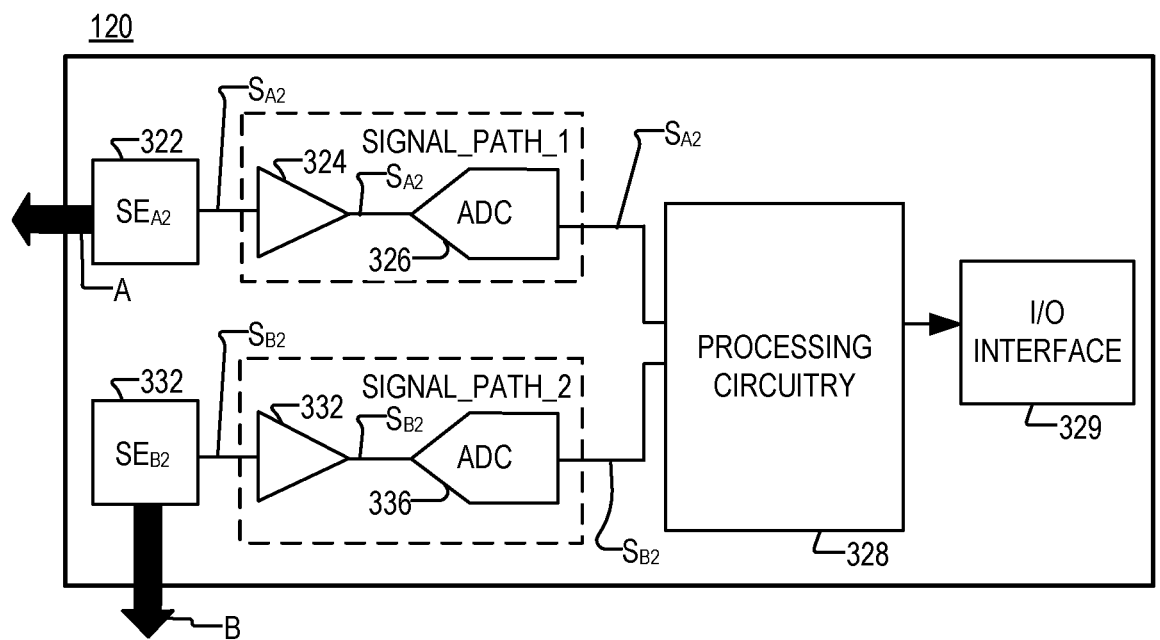
FIG. 3B is a circuit diagram of a magnetic field sensor, according to aspects of the disclosure.

FIG. 3B shows sensor 120 in further detail. As illustrated, sensor 120 may include a magnetic field sensing element 322, a magnetic field sensing element 332, an amplifier 324, an ADC 326, an amplifier 332, an ADC 336, a processing circuitry 328, and an output interface 329. The processing circuitry 328 may include any suitable type of processing circuitry. In some implementations, the processing circuitry 328 may include a CORDIC processor, an arithmetic-and-logic unit (ALU), a general-purpose processor, a special-purpose processor, a signal processor, and/or any other suitable type of processor. Although not shown, the processing circuitry may include any suitable type of volatile or non-volatile memory. The output interface 329 may include any suitable type of interface for outputting signals or data from sensor 120. By way of example, the I/O interface 329 may include any suitable type of analog or digital interface.

In some implementations, the I/O interface 329 may include a controller area network (CAN) bus interface, an I²C interface, or a Serial Peripheral Interface (SPI).

Each of the sensing elements 322 and 332 may include one or more of a planar Hall element, a vertical Hall element, a Circular Vertical Hall (CVH) element, an Indium Antimonide (InSb) element, a giant magnetoresistance (GMR) element, an anisotropic magnetoresistance element (AMR), a tunneling magnetoresistance (TMR) element, a magnetic tunnel junction (MTJ), a fluxgate, and/or a spin-valve. The sensing element 322 may have an axis of maximum sensitivity A, and the sensing element 322 may have an axis of maximum sensitivity B. The axis of maximum sensitivity A may be substantially perpendicular to the axis of maximum sensitivity B.

In one aspect, FIG. 3B illustrates that, when sensors 110 and 120 are installed on the PCB 272, the axes of maximum sensitivity of sensing elements 302 and 322 may have substantially the same orientation, and the axes of maximum sensitivity of sensing elements 312 and 332 may also have substantially the same orientation. Moreover, in some implementations, when the PCB 272 is installed over or to the side of the magnet 104, the axes of maximum sensitivity of sensing elements 302, 312, 322, and 332 may be substantially perpendicular to the axis of rotation of the magnet 104. As used throughout the disclosure, the phrase "substantially the same orientation" shall mean "within +/−10 degrees from having identical orientation." As used throughout the disclosure, the phrase, "substantially perpendicular" shall mean within +/−10 degrees of being arranged at an angle of exactly 90 degrees.

Under ideal circumstances, the axis of rotation of the magnet 104 (e.g., the Z-axis of coordinate system 150) may be substantially coincident with the central longitudinal axis of the ring magnet 104. In addition, as noted above, the sensor 110 (and the sensing elements 302, 312) may be disposed at a first location relative to the magnet 104, while the sensor 120 (and the sensing elements 322, 332) may be disposed at a second location relative to the magnet 104. In one implementation, the axis of maximum sensitivity A of each of sensing elements 302 and 322 may be arranged at a +45° angle relative to the X-axis of the coordinate system 150, and the axis of maximum sensitivity B of each of sensing elements 312 and 332 may be arranged at a −45° angle relative to the X-axis of the coordinate system. (E.g., see FIG. 1A, etc.). In other words, the sensing element 302 may be configured to measure the magnitude, at the first location, of a component of the magnetic field (of magnet 104) in a first direction—i.e., a direction that is offset from the X-axis of the coordinate system by +45 degrees. The sensing element 312 may be configured to measure the magnitude, at the second location, of a component of the magnetic field in a second direction—i.e., a direction that is offset from the X-axis of the coordinate system by −45°. It will be understood that the 45-degree angle is provided as an example only and the present disclosure is not limited to the axes of maximum sensitivity being oriented at a 45-degree angle from the X-axis. For example, in some implementations the axes of maximum sensitivity may be oriented at +60/−30-degree angles or +65/−25-degree angles, etc. The sensing element 322 may be configured to measure the magnitude, at the second location, of a component of the magnetic field in the first direction. And the sensing element 332 may be configured to measure the magnitude, at the second location, of the component of the magnetic field in the second direction. In the example of FIGS. 1A-3B, the axes of maximum sensitivity A and B are parallel to the plane defined by the X and Y axes of the coordinated system 150, however the present disclosure is not limited thereto.

In operation, the sensing element 322 may generate a signal $S_{A2}$ in response to a magnetic field that is produced by magnet 104, and provide the signal $S_{A2}$ to the amplifier 324. The amplifier 324 may amplify the signal $S_{A2}$ and provide the amplified signal $S_{A2}$ to the ADC 326. The ADC 326 may digitize the signal $S_{A2}$ and provide the digitized signal $S_{A2}$ to the processing circuitry 328. The sensing element 332 may generate a signal $S_{B2}$ in response to a magnetic field that is produced by magnet 104, and provide the signal $S_{B2}$ to the amplifier 334. The amplifier 334 may amplify the signal $S_{B2}$ and provide the amplified signal $S_{B2}$ to the ADC 336. The ADC 336 may digitize the signal $S_{B2}$ and provide the digitized signal $S_{B2}$ to the processing circuitry 328. In some implementations, the processing circuitry 328 may perform any suitable type of adjustment on the signals $S_{A2}$ and $S_{B2}$, such as temperature compensation or stress compensation. Additionally or alternatively, the processing circuitry 328 may either forward the signals $S_{A2}$ and $S_{A2}$ to an external sensor or device or process the signals $S_{A2}$ and $S_{B2}$ further. In some implementations, the processing circuitry 328 may be configured to perform any of the actions that are discussed further below with respect to FIGS. 7A-13.

FIG. 4A is a diagram illustrating an aspect of the operation of the system 100. In the example of FIG. 4A, the shaft 102 and magnet 104 have rotated by an angle $\delta_C$ relative to the Y-axis. The value $\delta_C$ is herein referred to as "the angular position" or "the position" of magnet 104 and/or the shaft 102. As is discussed further below, the sensors 110 and 120 may be used to determine the value of $\delta_C$.

FIG. 4B is an example of a combination model 400 for calculating the angular position $\delta_C$ of the magnet 104. As illustrated, in accordance with the model 400, the angular position may be calculated based on a first difference between signals $S_{A1}$ and $S_{A2}$ and a second difference between signals $S_{B1}$ and $S_{B2}$. Under the nomenclature of the present disclosure, the first difference between signals $S_{A1}$ and $S_{A2}$ is referred to as "C" or "signal C" and it can be calculated in accordance with equation 2, which is shown in FIG. 4B. Under the nomenclature of the present disclosure, the second difference between signals $S_{B1}$ and $S_{B2}$ is referred to as "S" or "signal S" and it can be determined in accordance with equation 1, which is shown in FIG. 4B. In some implementations, the value of $\delta_C$ may be determined by calculating the arctangent of the ratio of S and C, as illustrated by equation 3, which is also shown in FIG. 4B. Under the nomenclature of the present disclosure, the angular position $\delta_C$ of the magnet 104, which is calculated in accordance with the model 400 (or the model 450) is also referred to as "signal $\delta_C$." It will be understood that FIG. 4B provides an example of one possible implementation of the model 400. For example, in some implementations, the model 400 may be modified by weighing or offsetting the values of any of the signals $S_{A1}$, $S_{A2}$, $S_{B1}$, $S_{B2}$, C and S.

FIG. 4C shows an example of a legacy model 450 for calculating the angular position $\delta_C$ of the magnet 104. As illustrated by equation 4, which is shown in FIG. 4C, the legacy model 450 provides that the value of $\delta_C$ may be calculated by taking the arctangent of the ratio of signals $S_{A1}$ and $S_{B1}$ or by taking the arctangent of the ratio of signals $S_{A2}$ and $S_{B2}$. In other words, the legacy model 450 is based on the output of only one of the sensors 110 and 120, whereas the model 400 operates by combining the output of sensors 110 and 120. According to aspects of the disclosure, it has been determined that model 400 has a lower error than legacy models, such as the model 450.

Figure 5:
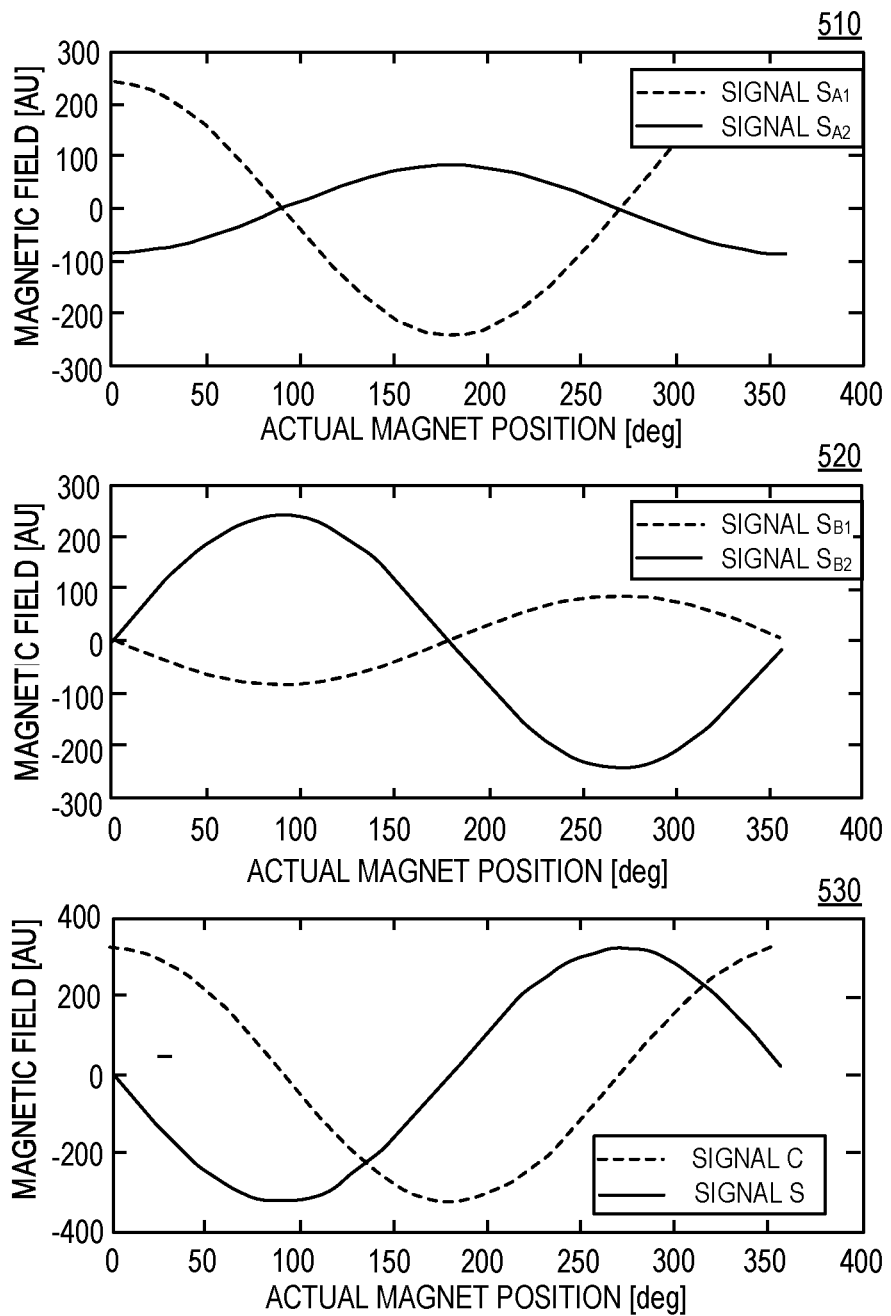
FIG. 5 shows plots illustrating aspects of the operation of a system, according to aspects of the disclosure.

FIG. 5 shows graphs 510, 520, and 530. Graph 510 illustrates the values of signals $S_{A1}$ and $S_{A2}$ as a function of the actual angular position of the magnet 104. Graph 520 shows the values of signals $S_{B1}$ and $S_{B2}$ as a function of the actual angular position of the magnet 104. Graph 530 shows the values of signals S and C as a function of the actual angular position of the magnet 104. Graph 530 illustrates, that the signals S and C may have substantially equalized amplitudes in comparison to signals $S_{A1}$ and $S_{B1}$ or signals $S_{A2}$ or $S_{B2}$, which in turn results in the signal $\delta_C$ having a lower error when the model 400 (shown in FIG. 4B) is used to calculate the value of the signal $\delta_C$, compared to model 450. FIG. 6 shows a graph 610 of the signal $\delta_C$ as a function of the actual angular position of the magnet 104. In the example of FIG. 6, the signal $\delta_C$ is calculated by evaluating the model 400 based on the values for signals S and C that are shown in graph 530. In addition, FIG. 6 shows a graph 620 of the error that is present in the signal $\delta_C$ (from graph 610) under ideal circumstances. Together, graphs 610 and 620 illustrate that the model 400 provides an accurate way of measuring the actual angular position of magnet 104. Under the nomenclature of the present disclosure, the "actual angular position" of the magnet 104 is the position of the magnet 104 in physical space, and the signal $\delta_C$ is the position that is measured by the system 100 (i.e., the position that ends up being detected by the system 100 when a certain amount of error is present in the detection). When permitted by context, the actual position may also be referred to as the "mechanical angle" of the magnet 104, and the value of $\delta_C$ may be referred to as the "calculated angle" of the magnet 104. In FIG. 5, the abbreviation AU stands for "arbitrary unit".

Figure 7B:
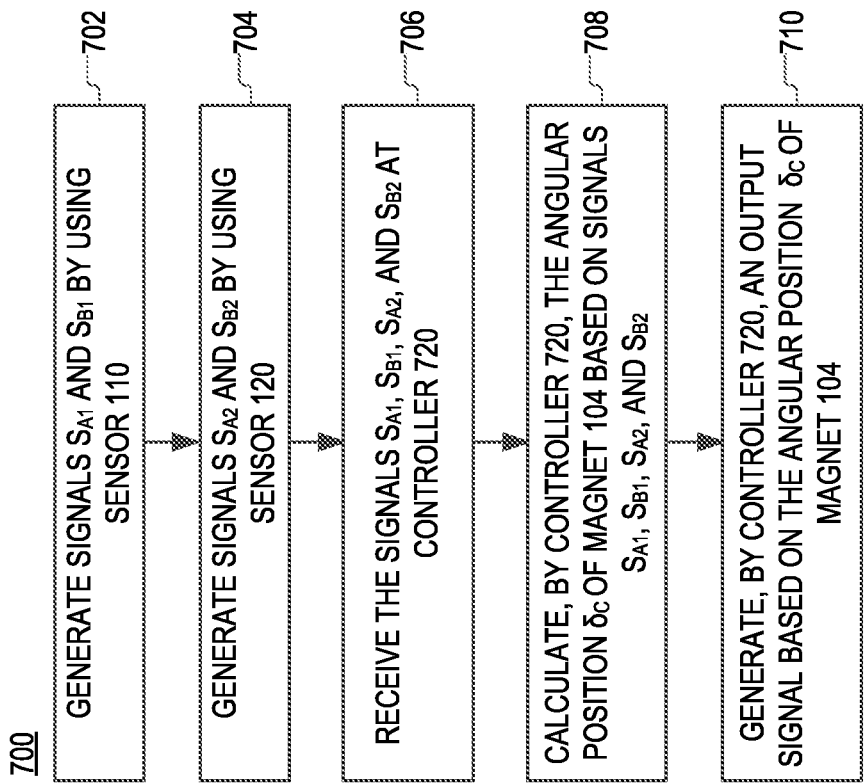
FIG. 7B is a flowchart of an example of a process, according to aspects of the disclosure.
Figure 7A:
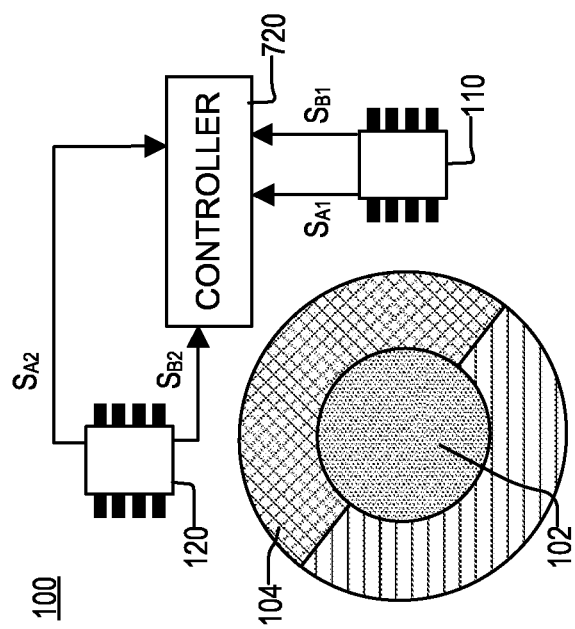
FIG. 7A is a diagram of an example of a system, according to aspects of the disclosure.

FIG. 7A illustrates an example of the system 100, in accordance with one implementation. In the example of FIG. 7A, the system 100 may include a controller 720 that is operatively coupled to the sensors 110 and 120. Sensor 110 may be configured to generate the signals $S_{A1}$ and $S_{B1}$ in response to the magnetic field of the magnet 104 and provide the generated signals $S_{A1}$ and $S_{B1}$ to the controller 720. Sensor 120 may be configured to generate the signals $S_{A2}$ and $S_{B2}$ in response to the magnetic field of the magnet 104 and provide the generated signals $S_{A2}$ and $S_{B2}$ to the controller 720. The controller 720 may be configured to calculate the angular position $\delta_C$ of the magnet 104 by evaluating the model 400 (shown in FIG. 4B) based on the received signals $S_{A1}$, $S_{B1}$, $S_{A2}$, and $S_{B2}$.

FIG. 7B is a flowchart of an example of a process 700 that is performed by the implementation of the system 100 which is shown in FIG. 7A. At step 702, signals $S_{A1}$ and $S_{B1}$ are generated by sensor 110. At step 704, signals $S_{A2}$ and $S_{B2}$ are generated by sensor 120. At step 706, signals $S_{A1}$, $S_{B1}$, $S_{A2}$, and $S_{B2}$ are received by controller 720. At step 708, controller 720 calculates the angular position $\delta_C$ of the magnet 104 by evaluating the model 400 based on the signals $S_{A1}$, $S_{B1}$, $S_{A2}$, and $S_{B2}$. At step 710, controller 720 generates an output signal based on the angular position $\delta_C$. In some implementations, the output signal may be a representation of the angular position $\delta_C$. Additionally or alternatively, in some implementations, the output signal may identify one or more of speed, acceleration, direction of travel, and/or any other characteristic of the movement of the magnet 104.

Figure 8A:
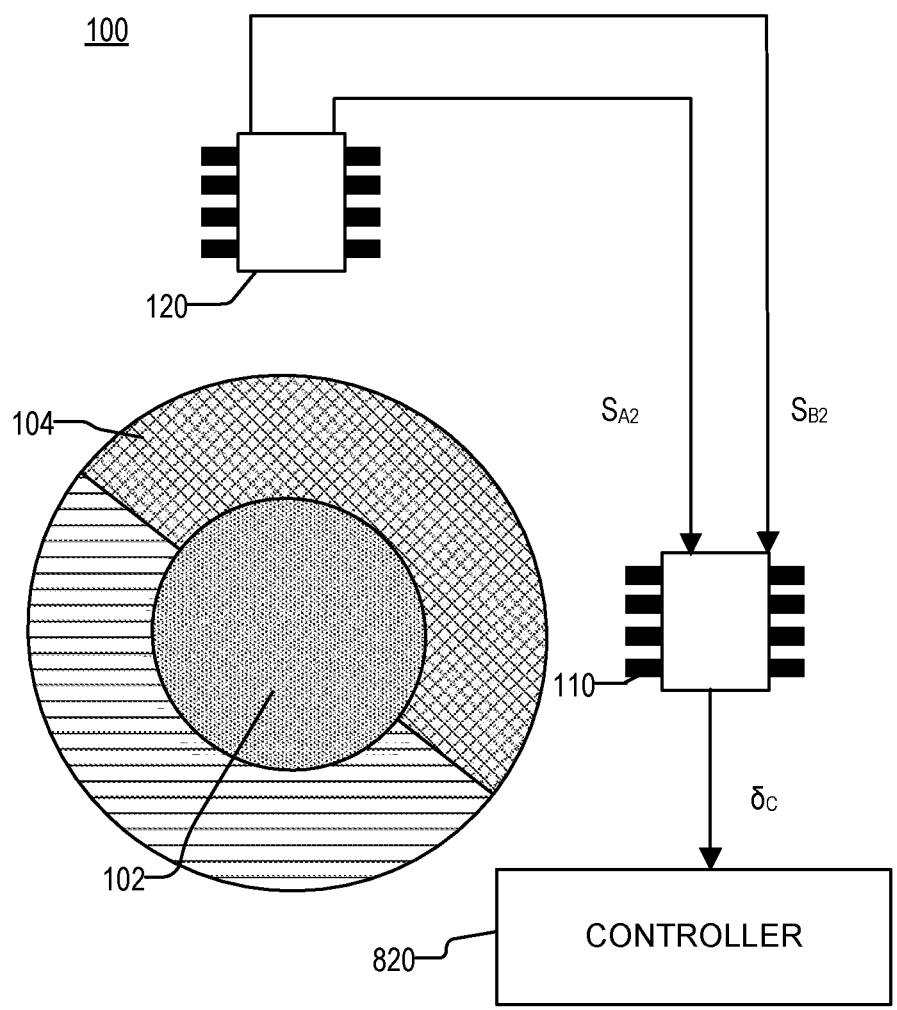
FIG. 8A is a diagram of an example of a system, according to aspects of the disclosure.

FIG. 8A illustrates an example of the system 100, in accordance with another implementation. In the example of FIG. 8A, the system 100 may include a controller 820. Sensor 120 may be operatively coupled to sensor 110, and sensor 110 may be operatively coupled to controller 820. Sensor 120 may be configured to generate signals $S_{A2}$ and $S_{B2}$ in response to the magnetic field of the magnet 104. In addition, sensor 120 may be configured to provide the generated signals $S_{A2}$ and $S_{B2}$ to sensor 110. Sensor 110 may generate the signals $S_{A1}$ and $S_{B1}$ in response to the magnetic field of the magnet 104. In addition, sensor 110 may calculate the angular position $\delta_C$ of the magnet 104 by evaluating the model 400 (shown in FIG. 4B) based on the signals $S_{A1}$, $S_{B1}$, $S_{A2}$, and $S_{B2}$. Sensor 110 may provide the angular position $\delta_C$ of the magnet 104 to controller 820.

Figure 8B:
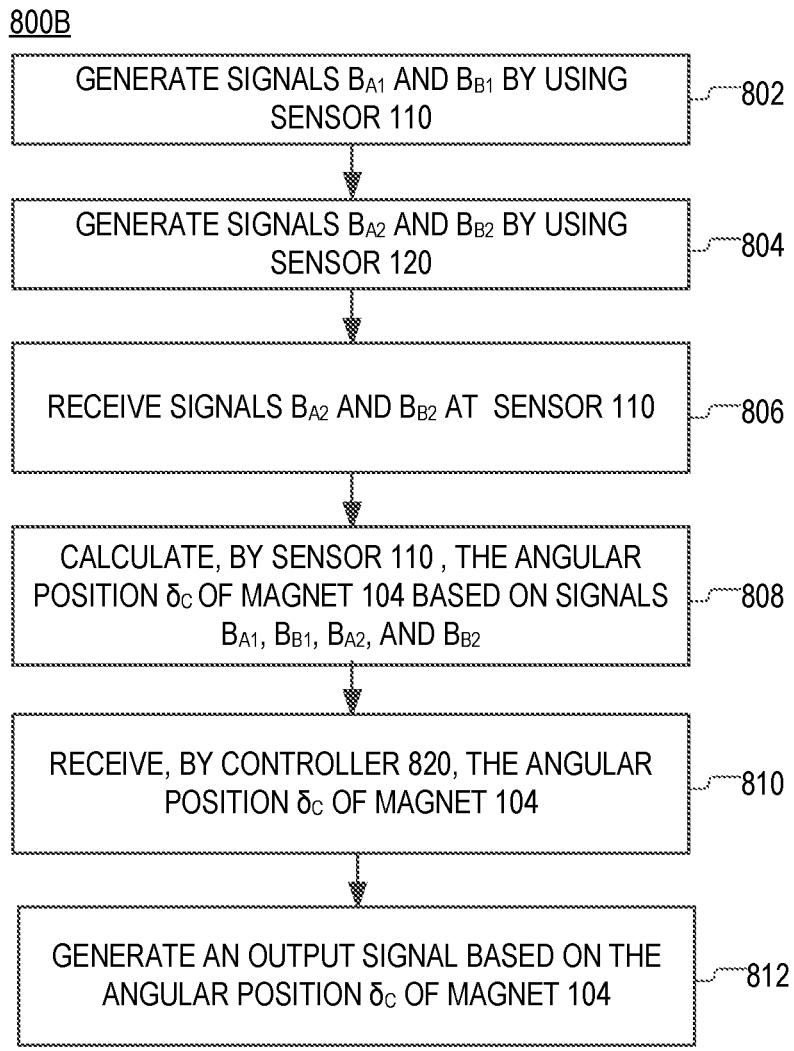
FIG. 8B is a flowchart of an example of a process, according to aspects of the disclosure.

FIG. 8B is a flowchart of an example of a process 800 that is performed by the implementation of the system 100 which is shown in FIG. 8A. At step 802, signals $S_{A1}$ and $S_{B1}$ are generated by sensor 110. At step 804, signals $S_{A2}$ and $S_{B2}$ are generated by sensor 120. At step 806, signals $S_{A2}$ and $S_{B2}$ are received by sensor 110. At step 808, sensor 110 calculates the angular position $\delta_C$ of the magnet 104 by evaluating the model 400 based on the signals $S_{A1}$, $S_{B1}$, $S_{A2}$, and $S_{B2}$. At step 810, controller 820 receives the angular position $\delta_C$ (calculated at step 808) from sensor 110. At step 812, controller 820 generates an output signal based on the angular position $\delta_C$ of the magnet 104. In some implementations, the output signal may be a representation of the angular position $\delta_C$ of the magnet 104. Additionally or alternatively, in some implementations, the output signal may identify one or more of speed, acceleration, direction of travel, and/or any other characteristic of the movement of magnet 104.

Figure 9A:
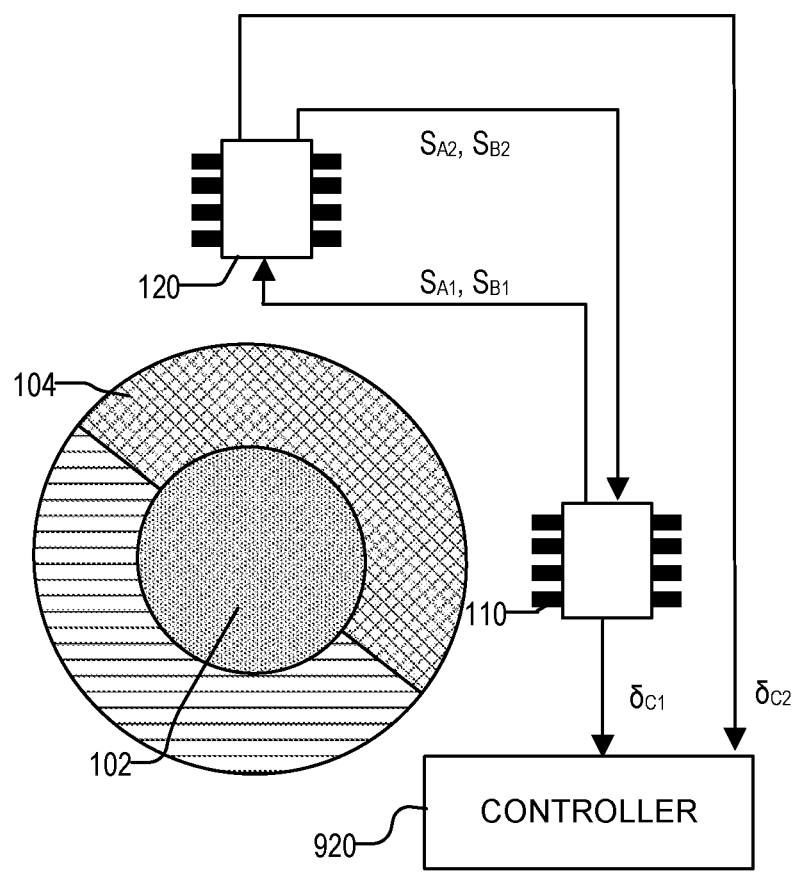
FIG. 9A is a diagram of an example of a system, according to aspects of the disclosure.

FIG. 9A illustrates an example of the system 100, in accordance with yet another implementation. In the example of FIG. 9A, the system 100 may include a controller 920. Sensor 120 may be operatively coupled to sensor 110 and controller 920, and sensor 110 may be operatively coupled to controller 920. Sensor 120 may be configured to generate signals $S_{A2}$ and $S_{B2}$ in response to the magnetic field of the magnet 104 and provide the generated signals $S_{A2}$ and $S_{B2}$ to sensor 110. Sensor 110 may be configured to generate signals $S_{A1}$ and $S_{B1}$ in response to the magnetic field of the magnet 104 and provide the generated signals $S_{A1}$ and $S_{B1}$ to sensor 120. Sensor 110 may generate a signal $\delta_{C1}$ by evaluating the model 400 (shown in FIG. 4B) based on signals $S_{A1}$, $S_{B1}$, $S_{A2}$, and $S_{B2}$. Sensor 110 may provide the generated signal $\delta_{C1}$ to controller 920. Sensor 120 may generate a signal $\delta_{C2}$ by evaluating the model 400 based on signals $S_{A1}$, $S_{B1}$, $S_{A2}$, and $S_{B2}$. Sensor 120 may provide the generated signal $\delta_{C2}$ to controller 920.

In the example FIG. 9A, signals $\delta_{C1}$ and $\delta_{C2}$ are different instances of the signal $\delta_C$, which is discussed above with respect to FIG. 4B, as well as FIGS. 7A-8B. As such, signals $\delta_{C1}$ and $\delta_{C2}$ both identify the angular position of the magnet 104. Absent a failure in one of sensors 110 and 120 (or the connection between sensors 110 and 120), signals $\delta_C$ and $\delta_{C2}$ would be identical or very similar to each other. However, if any of the sensors 110 or 120 have failed, or if the connection between sensors 110 and 120 has failed, the signals $\delta_{C1}$ and $\delta_{C2}$ may be different from one another. In this regard, calculating each of the signals $\delta_{C1}$ and $\delta_{C2}$ at a different one of the sensors 110-120, and providing the signals $\delta_{C1}$ and $\delta_{C2}$ to controller 920, enables the controller 920 to detect failures in the system 100 and react accordingly.

Figure 9B:
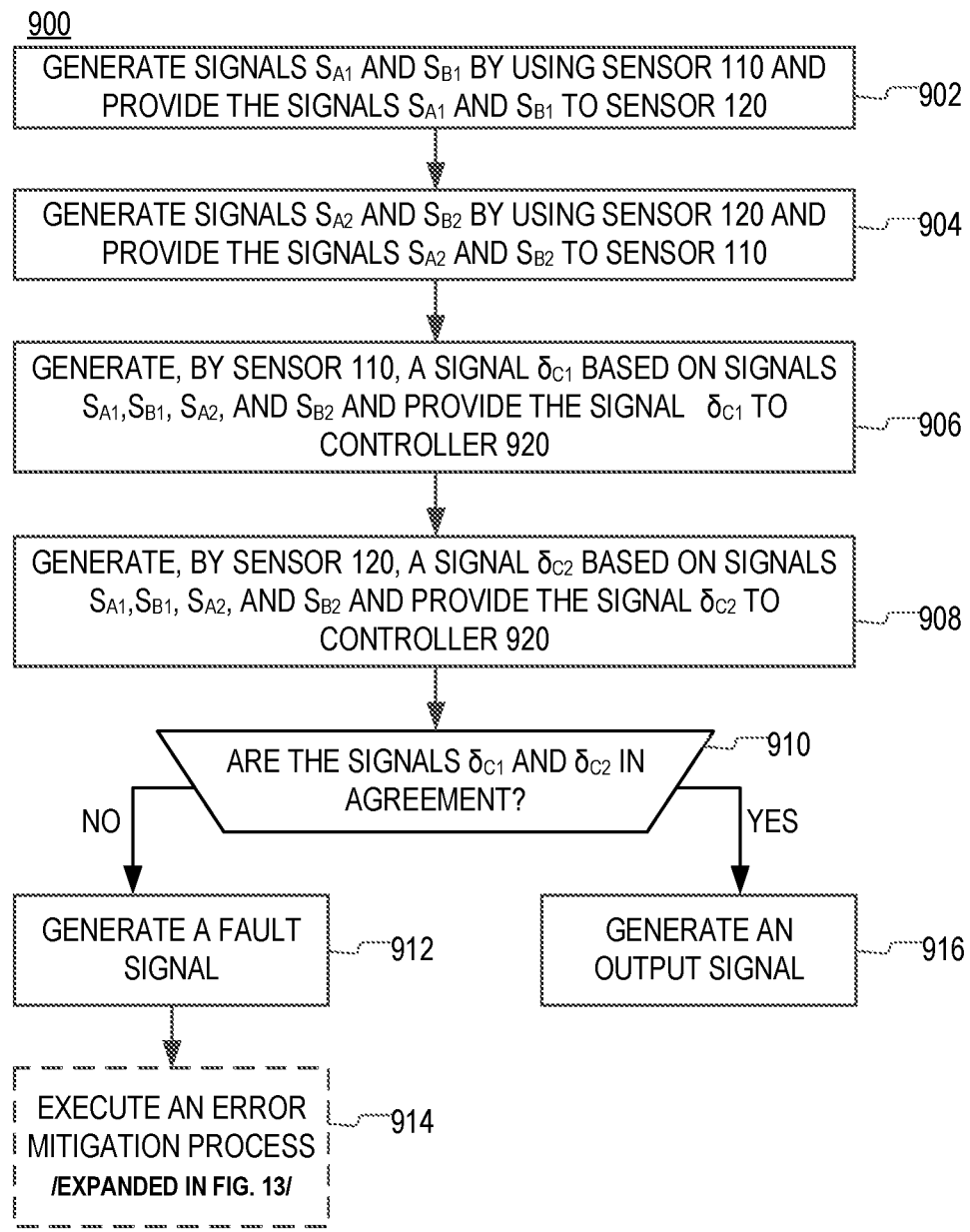
FIG. 9B is a flowchart of an example of a process, according to aspects of the disclosure.

FIG. 9B is a flowchart of an example of a process 900 that is performed by the implementation of the system 100 which is shown in FIG. 9A.

At step 902, sensor 110 generates the signals $S_{A1}$ and $S_{B1}$ and provides the signals $S_{A1}$ and $S_{B1}$ to sensor 120.

At step 904, sensor 120 generates the signals $S_{A2}$ and $S_{B2}$ and provides the signals $S_{A2}$ and $S_{B2}$ to sensor 110.

At step 906, sensor 110 generates the signal $\delta_{C1}$ and provides the signal $\delta_{c1}$ to the controller 920. According to the present example, the signal $\delta_{C1}$ is generated by evaluating the model 400 (shown in FIG. 4B) based on the values of signals $S_{A1}$, $S_{B1}$, $S_{B1}$, and $S_{B2}$ that are determined in steps 902 and 904, respectively.

At step 908, sensor 120 generates the signal $\delta_{C2}$ and provides the signal $\delta_{C2}$ to the controller 920. According to the present example, the signal $\delta_{C2}$ is generated by evaluating the model 400 (shown in FIG. 4B) based on the values of signals $S_{A1}$, $S_{B1}$, $S_{B1}$, and $S_{B2}$ that are determined in steps 902 and 904, respectively.

At step 910, the controller 920 determines if the signals $\delta_{C1}$ and $\delta_{C2}$ are in agreement with each other. According to the present example, the signals $\delta_{C1}$ and $\delta_{C2}$ are in agreement if the distance between signals $\delta_{C1}$ and $\delta_{C2}$ is less than a predetermined threshold. For example, if the difference between signals $\delta_{C1}$ and $\delta_{C2}$ is less than a predetermined value, the controller may determine that the signals $\delta_{C1}$ and $\delta_{C2}$ are in agreement with each other. On the other hand, if the difference between signals $\delta_{C1}$ and $\delta_{C2}$ is greater than or equal to the predetermined value, the controller may determine that the signals $\delta_{C1}$ and $\delta_{C2}$ are not in agreement with each other. If the signals $\delta_{C1}$ and $\delta_{C2}$ are in agreement, the process 900 proceeds to step 916. Otherwise, if the signals $\delta_{C1}$ and $\delta_{C2}$ are not in agreement, the process 900 proceeds to step 912.

At step 912, the controller 920 generates a fault signal. The fault signal may include any indication that the system 100 is experiencing a failure. The fault signal may be provided to an external device that is operatively coupled to the controller 920.

At step 914, the controller 920 optionally executes an error mitigation process. In some implementations, step 914 may be performed in accordance with the process 1300, which is discussed further below with respect to FIG. 13.

At step 916, the controller 920 generates an output signal. In some implementations, the output signal may be a representation of one of the signals $\delta_{C1}$ and $\delta_{C2}$. Additionally or alternatively, in some implementations, the output signal may be an average of the signals $\delta_{C1}$ and $\delta_{C2}$. Additionally or alternatively, in some implementations, the output signal may identify one or more of speed, acceleration, direction of travel, and/or any other characteristic of the movement of magnet 104.

Figure 10A:
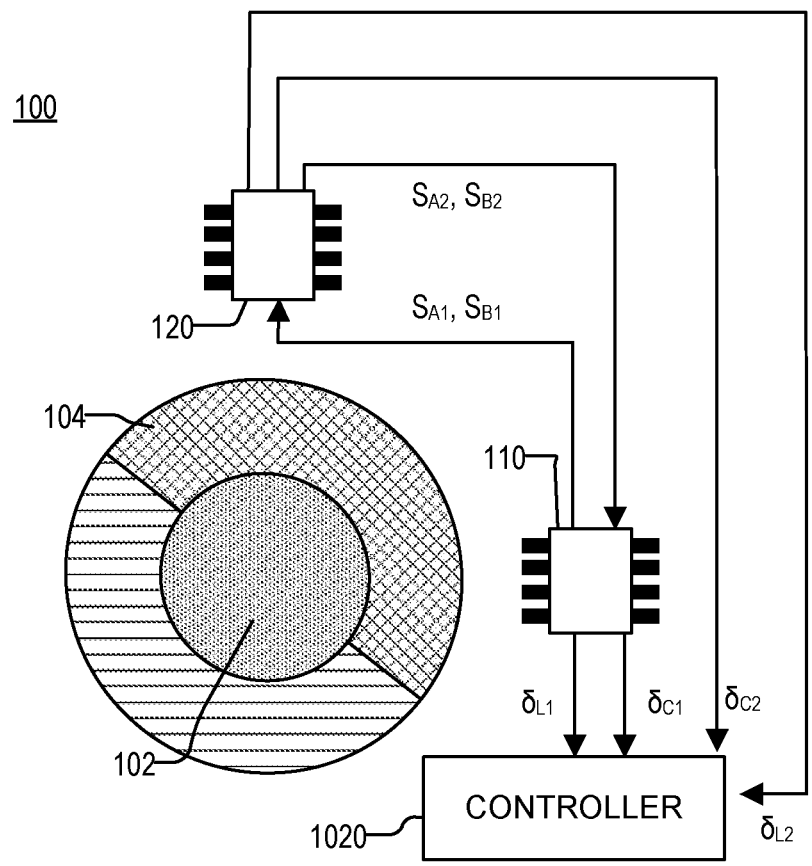
FIG. 10A is a diagram of an example of a system, according to aspects of the disclosure.

FIG. 10A illustrates an example of the system 100, in accordance with yet another implementation. In the example of FIG. 10A, the system 100 may include a controller 1020. Sensor 120 may be operatively coupled to sensor 110 and controller 1020, and sensor 110 may be operatively coupled to controller 1020. Sensor 120 may be configured to generate signals $S_{A2}$ and $S_{B2}$ in response to the magnetic field of magnet 104 and provide the generated signals $S_{A2}$ and $S_{B2}$ to sensor 110. Sensor 110 may be configured to generate signals $S_{A1}$ and $S_{B1}$ in response to the magnetic field of magnet 104 and provide the generated signals $S_{A1}$ and $S_{B1}$ to sensor 120. Sensor 110 may generate a signal $\delta_{C1}$ by evaluating the model 400 (shown in FIG. 4B) based on signals $S_{A1}$, $S_{B1}$, $S_{A2}$, and $S_{B2}$. Sensor 110 may further generate a signal 811 by evaluating the model 450 (shown in FIG. 4C) based on signals $S_{A1}$ and $S_{B1}$. Sensor 110 may provide the generated signals $\delta_{C1}$ and $\delta_{L1}$ to controller 1020. Sensor 120 may generate a signal $\delta_{C2}$ by evaluating the model 400 based on signals $S_{A1}$, $S_{B1}$, $S_{A2}$, and $S_{B2}$. Sensor 120 may further generate a signal $\delta_{L2}$ by evaluating the model 450 based on signals $S_{A2}$ and $S_{B2}$. Sensor 120 may provide the generated signals $\delta_{C2}$ and $\delta_{L2}$ to controller 1020.

As discussed above with respect to FIG. 9A, signals $\delta_{C1}$ and $\delta_{C2}$ may be different instances of the signal $\delta_C$, which is discussed above with respect to FIG. 4B, as well as FIGS. 7A-8B. Similarly, signals $\delta_{L1}$ and $\delta_{L2}$ may be different instances of the signal $\delta_L$, which is discussed above with respect to FIG. 4C. Absent a failure in one of sensors 110 and 120 (or the connection between sensors 110 and 120), signals $\delta_{C1}$ and $\delta_{C2}$ would be identical or very similar to each other. However, if any of the sensors 110 or 120 have failed, or if the connection between sensors 110 and 120 has failed, signals $\delta_{C1}$ and $\delta_{C2}$ may be different from one another. Similarly, absent a failure in one of sensors 110 and 120 (or the connection between the sensors 110 and 120), signals $\delta_{L1}$ and $\delta_{L2}$ would be quite similar to each other (as well as to signals $\delta_{C1}$ and $\delta_{C2}$). However, if any of the sensors 110 or 120 have failed, or if the connection between sensors 110 and 120 has failed, signals $\delta_{L1}$ and $\delta_{L2}$ may be different from one another (and/or signals $\delta_{C1}$ and $\delta_{C2}$). In this regard, calculating each of signals $\delta_{C1}$ and $\delta_{C2}$ (as well as each of signals $\delta_{L1}$ and $\delta_{L2}$) at a different one of the sensors 110-120, and providing signals $\delta_{C1}$, $\delta_{C2}$, $\delta_{L1}$, and $\delta_{L2}$ to controller 1020, enables controller 1020 to detect failures in the system 100 and react accordingly.

Figure 10B:
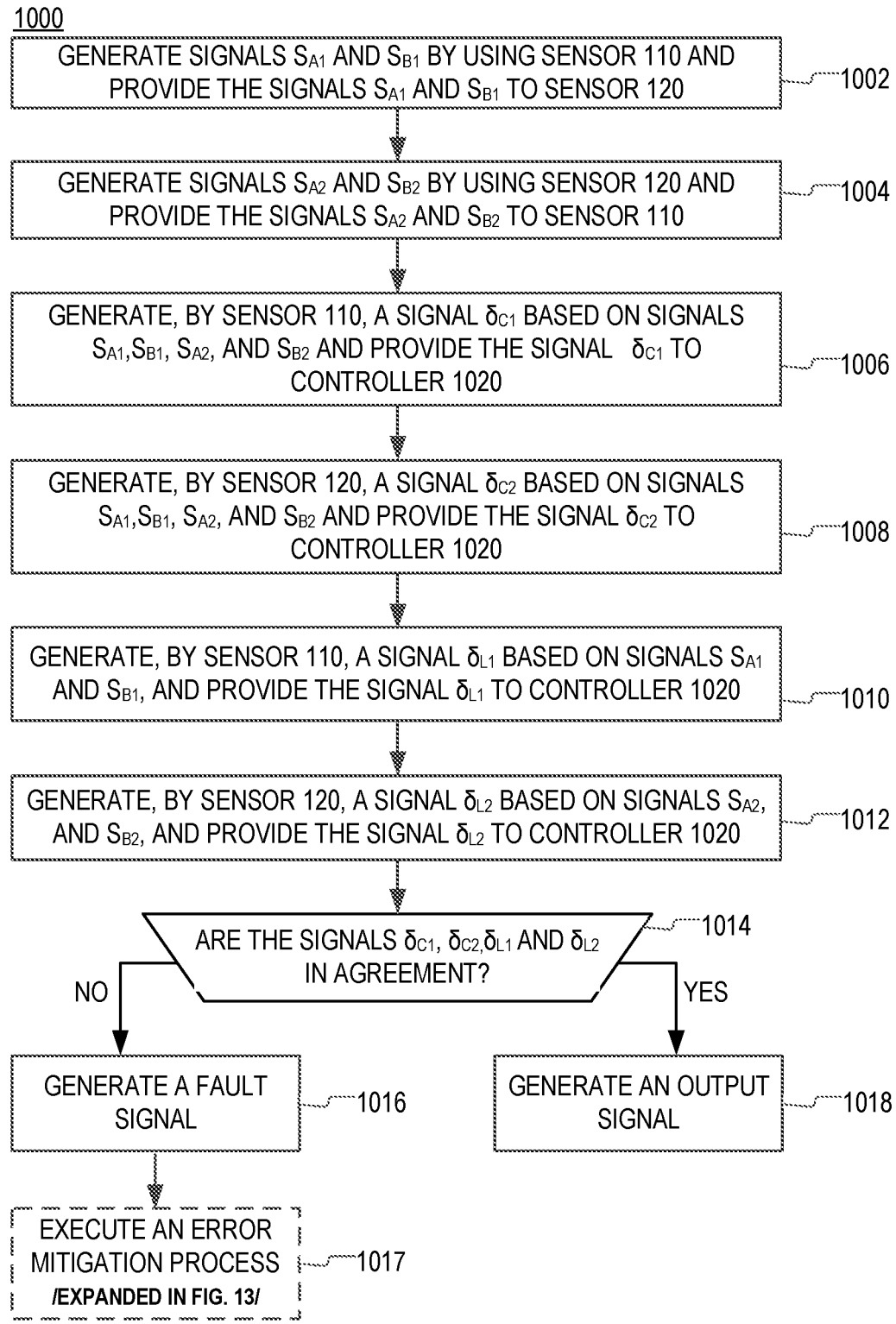
FIG. 10B is a flowchart of an example of a process, according to aspects of the disclosure.

FIG. 10B is a flowchart of an example of a process 1000 that is performed by the implementation of the system 100 which is shown in FIG. 10A.

At step 1002, sensor 110 generates the signals $S_{A1}$ and $S_{B1}$ provides the signals $S_{A1}$ and $S_{B1}$ to sensor 120.

At step 1004, sensor 120 generates the signals $S_{A2}$ and $S_{B2}$ and provides the signals $S_{A2}$ and $S_{B2}$ to sensor 110.

At step 1006, sensor 110 generates the signal $\delta_{C1}$ and provides the signal $\delta_{C1}$ to the controller 920. According to the present example, the signal $\delta_{C1}$ is generated by evaluating the model 400 (shown in FIG. 4B) based on the values of signals $S_{A1}$, $S_{B1}$, $S_{A2}$, and $S_{B2}$ that are determined in steps 1002 and 1004, respectively.

At step 1008, sensor 120 generates the signal $\delta_{C2}$ and provides the signal $\delta_{C2}$ to the controller 1020. According to the present example, the signal $\delta_{C2}$ is generated by evaluating the model 400 (shown in FIG. 4B) based on the values of signals $S_{A1}$, $S_{B1}$, $S_{A2}$, and $S_{B2}$ that are determined in steps 1002 and 1004, respectively.

At step 1010, sensor 110 generates the signal $\delta_{L1}$ and provides the signal $\delta_{L1}$ to the controller 1020. According to the present example, the signal $\delta_{L1}$ is generated by evaluating the model 450 (shown in FIG. 4C) based on the values of signals $S_{A1}$ and $S_{B1}$ that are determined in steps 1002.

At step 1012, sensor 120 generates the signal $\delta_{L2}$ and provides the signal $\delta_{L2}$ to the controller 1020. According to the present example, the signal 812 is generated by evaluating the model 450 (shown in FIG. 4C) based on the values of signals $S_{A2}$ and $S_{B2}$ that are determined at step 1004.

At step 1014, the controller 1020 determines if the signals $\delta_{C1}$, $\delta_{C2}$, $\delta_{L1}$ and $\delta_{L2}$ are in agreement with each other. According to the present example, the signals $\delta_{C1}$, $\delta_{C2}$, $\delta_{L1}$, and $\delta_{L2}$ are considered to be in agreement if the distance between signals $\delta_{C1}$ and $\delta_{C2}$ is less than a first predetermined threshold T1 and if the distance between signals $\delta_{L1}$ and $\delta_{L2}$ is less than a second predetermined threshold T2. For example, if $\{(|\delta_{C1}-\delta_{C2}|<T1) \text{ AND } (|\delta_{L1}-\delta_{L2}|<T2)\}$ is true, the signals $\delta_{C1}$, $\delta_{C2}$, $\delta_{L1}$ and $\delta_{L2}$ may be considered to be in agreement. However, if $\{(|\delta_{C1}-\delta_{C2}|>T1) \text{ OR } (|\delta_{L1}-\delta_{L2}|>T2)\}$ is true, the signals $\delta_{C1}$, $\delta_{C2}$, $\delta_{L1}$, and $\delta_{L2}$ may be considered to be not in agreement. According to the present example, the thresholds T1 and T2 are different from another. However, alternative implementations are possible in which they are the same. Those of ordinary skill in the art will readily recognize, after reading this disclosure, that there are various ways to determine if redundant signals agree with each other. For this reason, the present disclosure is not limited to any specific method for determining whether the signals $\delta_{C1}$, $\delta_{C2}$, $\delta_{L1}$, and $\delta_{L2}$ are in agreement with each other. If the signals $\delta_{C1}$, $\delta_{C2}$, $\delta_{L1}$, and $\delta_{L2}$ are in agreement, the process 1000 proceeds to step 1018. Otherwise, the process 1000 proceeds to step 1016.

At step 1016, the controller 1020 generates a fault signal. The fault signal may include any indication that the system 100 is experiencing a failure. The fault signal may be provided to an external device that is operatively coupled to the controller 1020.

At step 1017, the controller 1020 optionally executes an error mitigation process. In some implementations, step 1017 may be performed in accordance with the process 1300, which is discussed further below with respect to FIG. 13.

At step 1018, the controller 1020 generates an output signal. In some implementations, the output signal may be a representation of one of the signals $\delta_{C1}$ and $\delta_{C2}$. Additionally or alternatively, in some implementations, the output signal may be an average of the signals $\delta_{C1}$ and $\delta_{C2}$. Additionally or alternatively, in some implementations, the output signal may identify one or more of speed, acceleration, direction of travel, and/or any other characteristic of the movement of magnet 104.

Figure 11A:
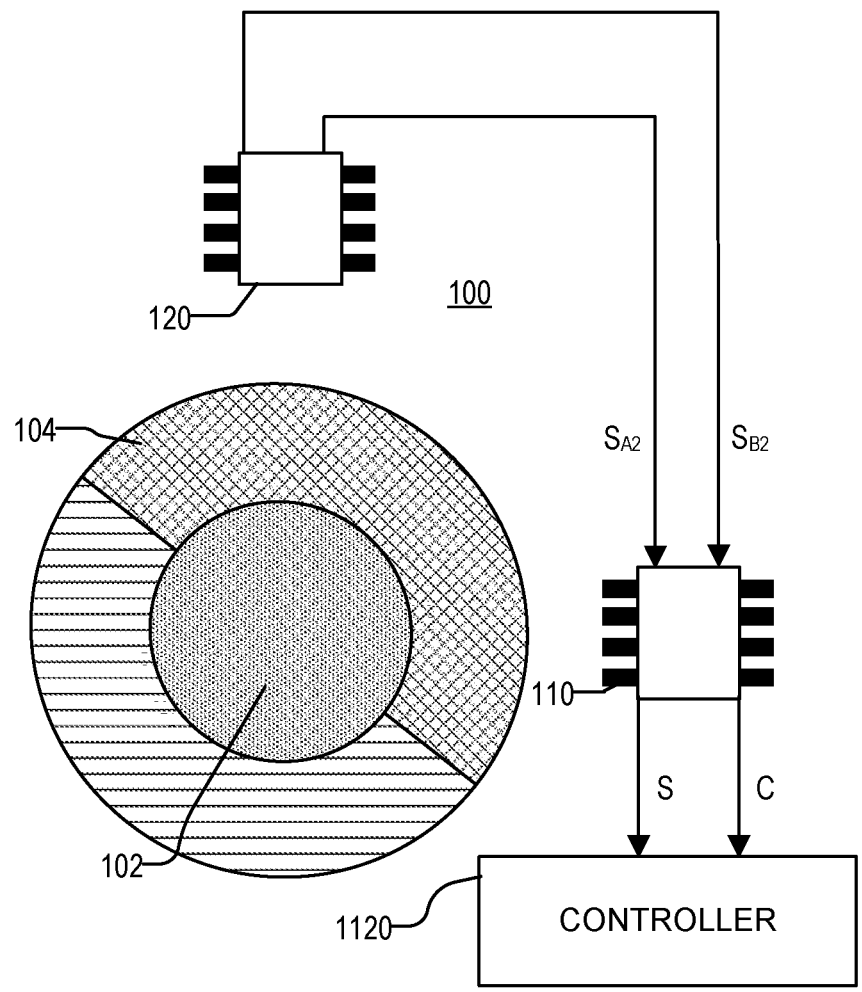
FIG. 11A is a diagram of an example of a system, according to aspects of the disclosure.

FIG. 11A illustrates an example of the system 100, in accordance with yet another implementation. In the example of FIG. 11A, the system 100 may include a controller 1120. Sensor 120 may be operatively coupled to sensor 110, and sensor 110 may be operatively coupled to controller 1120. Sensor 120 may be configured to generate signals $S_{A2}$ and $S_{B2}$ in response to the magnetic field of magnet 104 and provide the generated signals $S_{A2}$ and $S_{B2}$ to sensor 110. Sensor 110 may be configured to generate signals $S_{A1}$ and $S_{B1}$ in response to the magnetic field of magnet 104. Sensor 110 may be further configured to generate a signal C based on signals $S_{A1}$ and $S_{A2}$, and a signal S based on signals $S_{B1}$ and $S_{B2}$. In some implementations, the signals S and C may be generated in accordance with equations 1 and 2 of the model 400, both of which are shown in FIG. 4B. After signals S and C are generated, sensor 110 may provide signals S and C to controller 1120. Controller 1120 may generate the signal $\delta_C$ based on the signals S and C. The signal $\delta_C$ may be generated in accordance with equation 3 of the model 400 (shown in FIG. 4B).

Figure 11B:
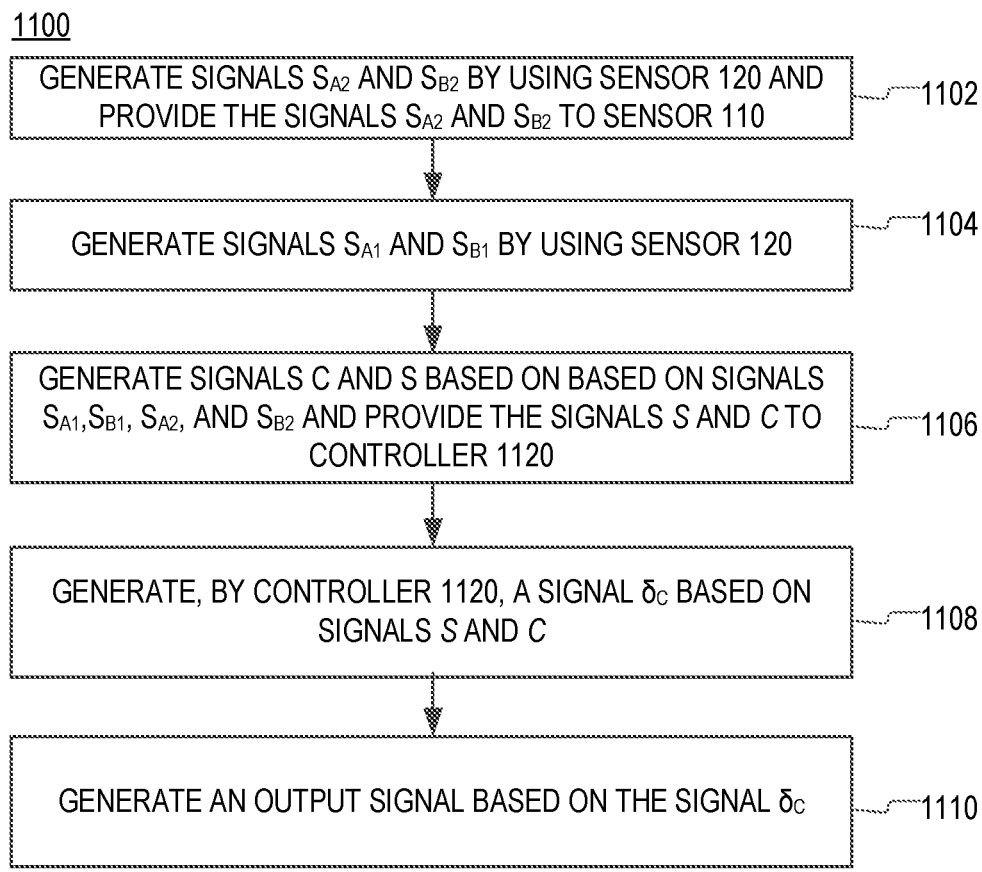
FIG. 11B is a flowchart of an example of a process, according to aspects of the disclosure.

FIG. 11B is a flowchart of an example of a process 1100 that is performed by the implementation of the system 100 which is shown in FIG. 11A.

At step 1102, sensor 120 generates the signals $S_{A2}$ and $S_{B2}$ provides the signals $S_{A2}$ and $S_{B2}$ to sensor 110.

At step 1104, sensor 110 generates the signals $S_{A1}$ and $S_{B1}$.

At step 1106, sensor 110 generates a signal S and a signal C. The signal C is generated based on signals $S_{A1}$ and $S_{A2}$. The signal C may be calculated in accordance with equation 2 of the model 400 (shown in FIG. 4B). The signal S is generated based on signals $S_{B1}$ and $S_{B2}$. The signal S may be calculated in accordance with equation 1 of the model 400 (shown in FIG. 4B). After signals S and C are generated, they are provided by sensor 110 to the controller 1120.

At step 1108, the controller 1120 generates signal $\delta_C$. The signal $\delta_C$ is generated based on the signals S and C. The signal $\delta_C$ may be calculated in accordance with equation 3 of the model 400 (shown in FIG. 4B).

At step 1110, the controller 1120 generates an output signal based on the signal $\delta_C$. In some implementations, the output signal may be a representation of the signal $\delta_C$. Additionally or alternatively, in some implementations, the output signal may identify one or more of speed, acceleration, direction of travel, and/or any other characteristic of the movement of magnet 104.

Figure 12A:
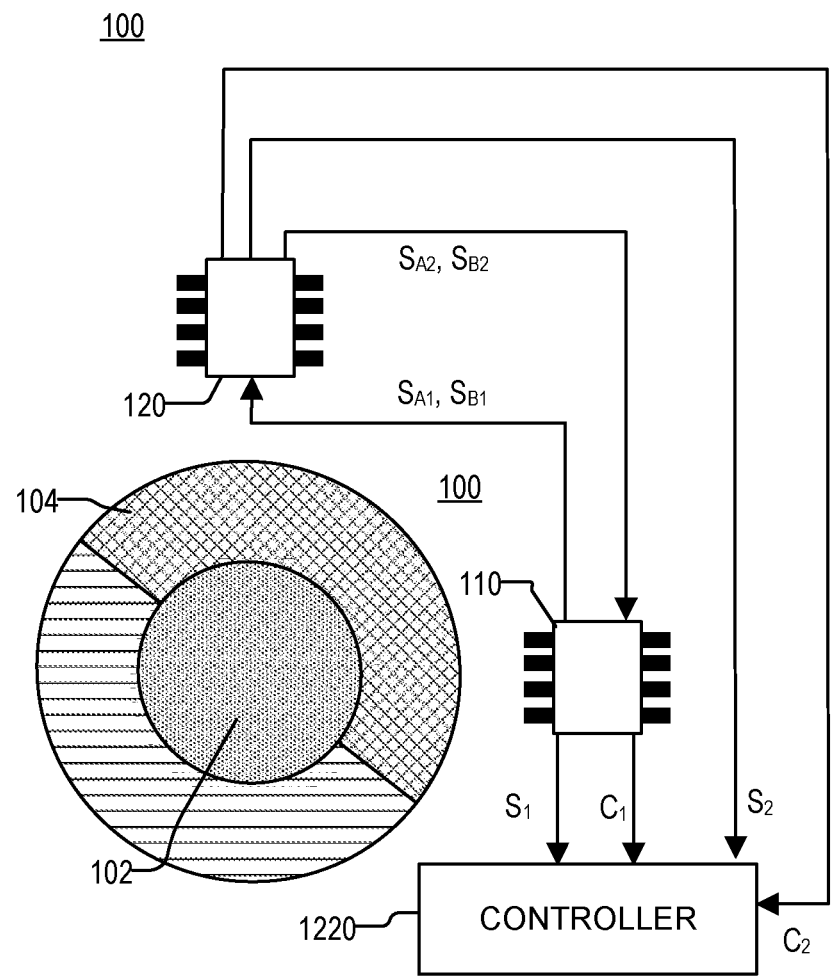
FIG. 12A is a diagram of an example of a system, according to aspects of the disclosure.

FIG. 12A illustrates an example of the system 100, in accordance with yet another possible implementation. In the example of FIG. 12A, the system 100 may include a controller 1220. Sensors 110 and 120 may be operatively coupled to each other and to controller 1220. Sensor 110 may be configured to generate signals $S_{A1}$ and $S_{B1}$ in response to the magnetic field of magnet 104 and provide the signals $S_{A1}$ and $S_{B1}$ to sensor 120. Sensor 120 may be configured to generate signals $S_{A2}$ and $S_{B2}$ in response to the magnetic field of magnet 104 and provide the signals $S_{A2}$ and $S_{B2}$ to sensor 110. Sensor 110 may be configured to generate signals $S_1$ and $C_1$ and provide the signals $S_1$ and $C_1$ to controller 1220. Signal $S_1$ may be generated by evaluating equation 1 of the model 400 (shown in FIG. 4B) based on signals $S_{B1}$ and $S_{B2}$. Signal $C_1$ may be generated by evaluating equation 2 of the model 400 based on signals $S_{A1}$ and $S_{A2}$. Sensor 120 may be configured to generate signals $S_2$ and $C_2$ and provide the signals $S_2$ and $C_2$ to controller 1220. Signal $C_2$ may be generated by evaluating equation 2 of the model 400 based on signals $S_{A1}$ and $S_{A2}$. Signal $S_2$ may be generated by evaluating equation 1 of the model 400 based on signals $S_{B1}$ and $S_{B2}$.

Absent a failure in one of sensors 110 and 120 (or the connection between sensors 110 and 120), signals $C_1$ and $C_2$ would be identical or very similar to each other. However, if any of the sensors 110 or 120 have failed, or if the connection between sensors 110 and 120 has failed, signals $C_1$ and $C_2$ may be different from one another. Similarly, absent a failure in one of sensors 110 and 120 (or the connection between the sensors 110 and 120), signals $S_1$ and $S_2$ would be identical or very similar to each other. However, if any of the sensors 110 or 120 have failed, or if the connection between sensors 110 and 120 has failed, signals $S_1$ and $S_2$ may differ from one another. In this regard, calculating each of signals $C_1$ and $C_2$ (as well as each of signals $S_1$ and $S_2$) at a different one of the sensors 110-120, and providing signals $C_1$, $C_2$, $S_1$, and $S_2$ to controller 1120 enables controller 1120 to detect failures in the system 100 and react accordingly.

Figure 12B:
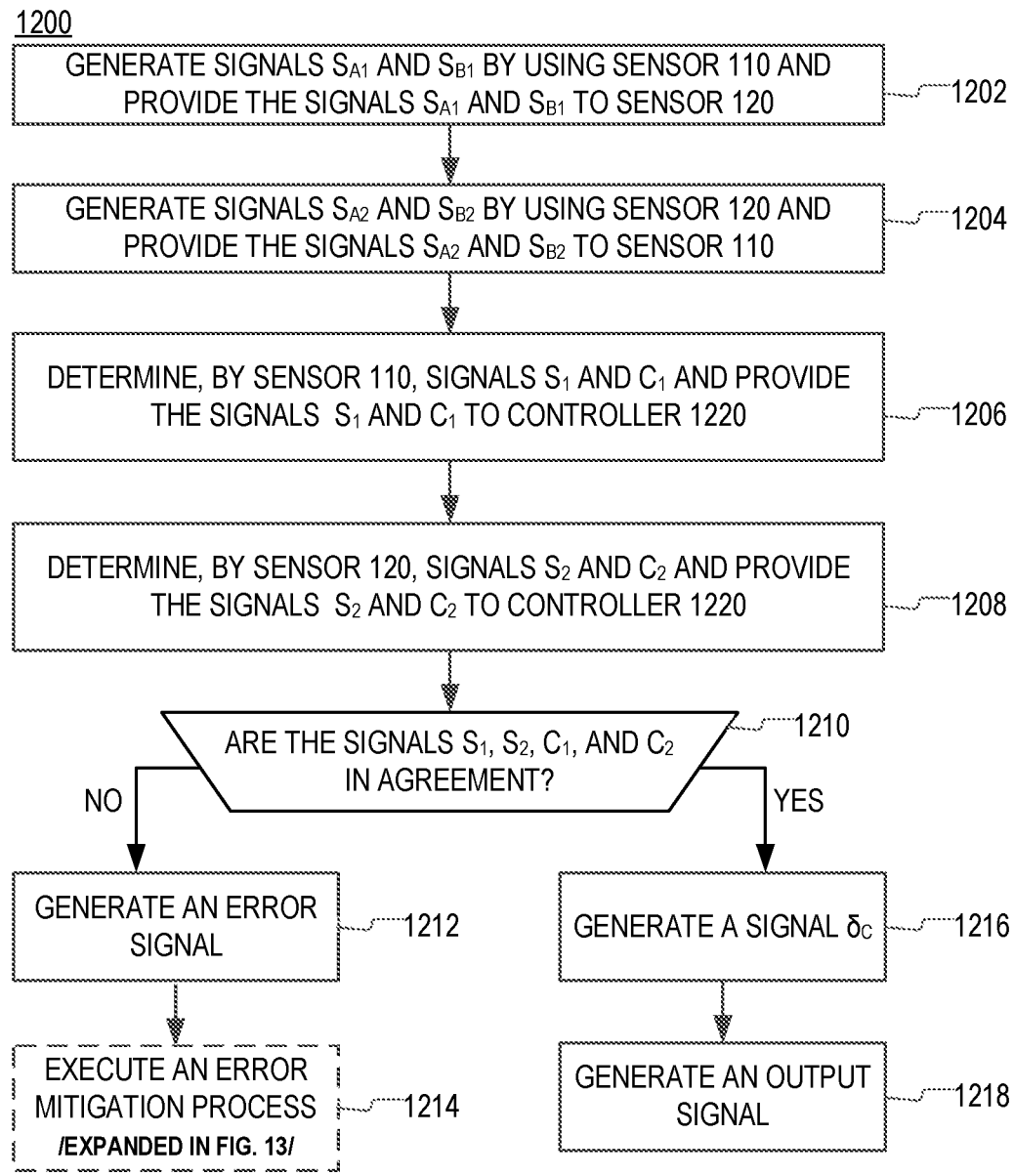
FIG. 12B is a flowchart of an example of a process, according to aspects of the disclosure.

FIG. 12B is a flowchart of an example of a process 1200 that is performed by the implementation of the system 100 which is shown in FIG. 12A.

At step 1202, sensor 110 generates the signals $S_{A1}$ and $S_{B1}$ provides the signals $S_{A1}$ and $S_{B1}$ to sensor 120.

At step 1204, sensor 120 generates the signals $S_{A2}$ and $S_{B2}$ and provides the signals $S_{A2}$ and $S_{B2}$ to sensor 110.

At step 1206, sensor 110 generates the signal $S_1$ and signal $C_1$ and provides the signals $S_1$ and $C_1$ to the controller 1220.

At step 1208, sensor 120 generates the signals $S_2$ and signal $C_2$ and provides the signals $S_2$ and $C_2$ to the controller 1220.

At step 1210, the controller 1210 determines if the signals $S_1$, $S_2$, $C_1$, and $C_2$ are in agreement. According to the present example, the signals $S_1$, $S_2$, $C_1$, and $C_2$ are considered to be in agreement if the distance between signals $C_1$ and $C_2$ is less than a first predetermined threshold T1 and if the distance between signals $S_1$ and $S_2$ is less than a second predetermined threshold T2. For example, if $\{(|C_1-C_2|<T1)$ AND $(|S_1-S_2|<T2)\}$ is true, the signals $S_1$, $C_1$, $S_2$, and $C_2$ may be considered to be in agreement. However, if $\{(|C_1-C_2|>T1)$ OR $(|S_1-C_2|>T2)\}$ is true, the signals $S_1$, $C_1$, $S_2$, and $C_2$ may be considered to be not in agreement. According to the present example, the thresholds T1 and T2 are different from each other. However, alternative implementations are possible in which they are the same. Those of ordinary skill in the art will readily recognize, after reading this disclosure, that there are various ways to determine if redundant signals agree with each other. For this reason, the present disclosure is not limited to any specific method for determining whether the signals $S_1$, $S_2$, $C_1$, and $C_2$ are in agreement with each other. If the signals $S_1$, $S_2$, $C_1$, and $C_2$ are in agreement, the process 1200 proceeds to step 1216. Otherwise, the process 1200 proceeds to step 1212.

At step 1212, the controller 1020 generates a fault signal. The fault signal may include any indication that the system 100 is experiencing a failure. The fault signal may be provided to an external device that is operatively coupled to the controller 1020.

At step 1214, the controller 1020 optionally executes an error mitigation process. In some implementations, step 1214 may be performed in accordance with the process 1300, which is discussed further below with respect to FIG. 13.

At step 1216, the controller 1220 generates a signal $\delta_C$. The signal $\delta_C$ is generated based on at least one of the signals $S_1$ and $S_2$ and at least one of the signals $C_1$ and $C_2$. The signal $\delta_C$ may be calculated in accordance with equation 3 of the model 400 (shown in FIG. 4B).

At step 1218, the controller 1120 generates an output signal based on the signal $\delta_C$. In some implementations, the output signal may be a representation of the signal $\delta_C$. Additionally or alternatively, in some implementations, the output signal may identify one or more of speed, acceleration, direction of travel, and/or any other characteristic of the movement of magnet 104.

Figure 13:
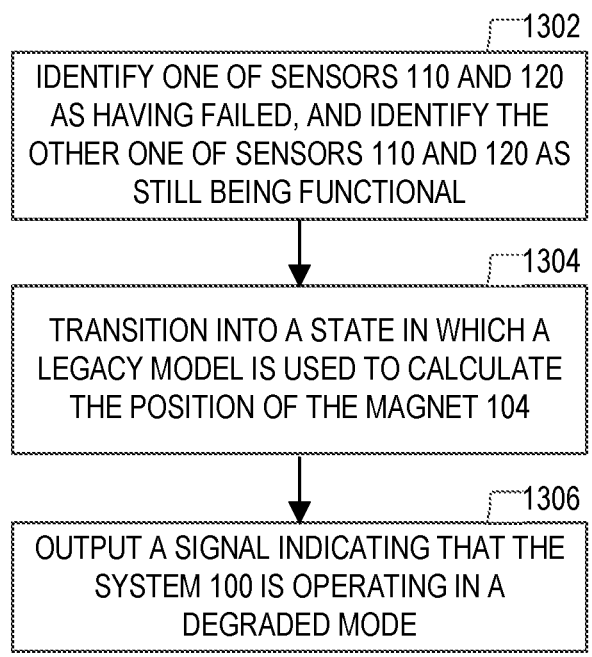
FIG. 13 is a flowchart of an example of a process, according to aspects of the disclosure.

FIG. 13 is a diagram of an example of a process 1300 for taking corrective action when data provided by sensors 110 and 120 is not in agreement. The process 1300 may be performed by a controller, such as one of the controllers 920, 1020, and 1220. However, the process 1300 is not limited to any specific entity performing the process 1300.

At step 1302, the controller identifies one of the sensors 110 and 120 as having failed and the other one of the sensors 110 and 120 as still being functional. In implementations in which sensors 110 and 120 are provided with internal diagnostics, the controller may use respective diagnostic signals that are output by sensors 110 and 120 to determine which one of them has failed, and which one is still operational. Alternatively, in some implementations, the controller may determine which one of sensors 110 and 120 has failed based on data that is provided by that sensor to the controller. For example, if the value of a signal that is provided by a sensor is out of normal bounds or appears stuck, the controller may determine that the sensor has failed. Those of ordinary skill in the art will readily recognize, after reading this disclosure, that there are various ways of identifying a failed sensor. In this regard, it will be understood that the present disclosure is not limited to any specific method for identifying a failed sensor.

At step 1304, the controller transitions the system 100 from a first state in which a combined model is used to calculate the position of magnet 104 to a second state in which a legacy model is used to calculate the position The legacy model may include any model that relies on the output of only two sensing elements to calculate the position of magnet 104. For example, a legacy model may calculate the position of magnet 104 by using only signals $S_{A1}$ and $S_{B1}$, and without using signals $S_{A2}$ and $S_{B2}$. As another example, a legacy model may calculate the position of magnet 104 by using only signals $S_{A2}$ and $S_{B2}$, and without using signals $S_{A1}$ and $S_{B1}$. An example of a legacy model is the model 450 which is discussed above with respect to FIG. 4C. A combined model for calculating the position of magnet 104 may include any model that relies on the output of four sensing elements to calculate the position of magnet 104. An example of a combined model is the model 400, which is discussed above with respect to FIG. 4B. As noted above, according to the present disclosure, the combined model 400 has been determined to have higher accuracy (or lower error) than the legacy model 450.

At step 1306, the controller 104 outputs an indication that the system 100 is operating in a degraded mode. The degraded mode may be a mode in which the position of the magnet 104 is determined based on signals provided by only one of sensors 110 and 120, which remains operational. In other words, the degraded mode may be a mode in which the position of the magnet 104 is determined by using a legacy model, such as the model 450.

FIGS. 7-13 provide examples of different configurations of the system 100, in which a controller is configured to obtain the position of the rotating target. Obtaining the position of the rotating target may include one or more of: (i) receiving signals $S_{A1}$, $S_{B2}$, $S_{A2}$, and $S_{B1}$ and calculating the position based on those signals, (ii) receiving signals S and C and calculating the position based on those signals, (iii) receiving an indication of the position, (iv) storing an indication of the position of the memory and/or loading the indication of the position in a predetermined memory location. In the examples of FIGS. 9A-B, 10A-B, and 12A-B, the system 100 is configured to operate in a redundant manner. The redundancy in those configurations may be useful in achieving a high Automotive Safety Integrity Level (ASIL) rating and/or improving the overall reliability and dependability of the system 100. The term "output signal" as used throughout the specification may refer to any signal that is generated by a controller. For example, an output signal may be a signal that is provided by the controller to an external device. As another example, an output signal may be one signal that constitutes the output of a particular operation. As yet another signal, an output signal may be a signal that is provided from one unit of a controller to another unit of the same controller. As yet another aspect, an output signal may be a signal that is stored in a particular memory location, from where it can be retrieved and used in the performance of a subsequent operation. Stated succinctly, a generated output signal may or may not be a signal that is output to an external device.

To make the system 100 less sensitive to placement tolerances, some compensations can be put in place. For example, linearization can be applied to the calculated angles $\delta_C$. As another example, the signals S and C can be normalized before calculating the angles.

The use of two-sensor integrated circuits (ICs) may be advantageous because in the system redundancy is more and more required in autonomous vehicles and other emerging applications. Indeed, with legacy methods, to achieve redundancy a second IC is needed (or a single dual die IC) while the redundancy is inherent to this proposed invention.

In order to enhance even further the safety performances (ASIL rating for example), a heterogenous redundancy can be easily put in place in the system 100: the sensor 110 may use a first magnetic technology and the sensor 120 would use a second magnetic technology, different from the first technology. For example, the sensor 110 may use two vertical Hall to measure the magnetic field of the magnet 104 while the sensor 120 may use one or more TMR (Tunnel Magnetoresistance) bridges.

The communication between sensors 110 and 120 may need to be resistant to electromagnetic interference, especially if it is analog and R is large (>few cm): in this case, electromagnetic perturbations (EMI/EMC) may corrupt the sin/cos signals. In this regard, the PCB 227 (shown in FIG. 2D) may be provided with shielding that is configured to shield one or more lines that are used to carry communications between sensor 110, sensor 120, and the controller 166. With analog signals, it might be necessary to shield the connections. If a digital protocol is used, shielding may be necessary to a lesser extent.

As used throughout the disclosure, the notation "$SE_{A1}$", "$SE_{B1}$", "$SE_{A2}$", and "$SE_{A2}$" is used to distinguish between different sensing elements. The use of this notation to reference sensing elements does not imply any specific configuration of the sensing elements that are referenced. Furthermore, the use of the notation does not specify any specific configuration of the sensors that contain the referenced sensing elements. FIGS. 3A-B are provided to illustrate only one possible implementation of the sensors 110 and 120. In this regard, it will be understood that the present disclosure is not limited to any specific implementation of the sensors 110 and 120.

As used herein, the term "magnetic field sensing element" is used to describe a variety of electronic elements that can sense a magnetic field. The magnetic field sensing element can be, but is not limited to, a Hall Effect element, a fluxgate, a magnetoresistance element, or a magneto transistor. As is known, there are different types of Hall Effect elements, for example, a planar Hall element, a vertical Hall element, and a Circular Vertical Hall (CVH) element. As is also known, there are different types of magnetoresistance elements, for example, a semiconductor magnetoresistance element such as Indium Antimonide (InSb), a giant magnetoresistance (GMR) element, an anisotropic magnetoresistance element (AMR), a tunneling magnetoresistance (TMR) element, a magnetic tunnel junction (MTJ), a spin-valve, etc. The magnetic field sensing element may be a single element or, alternatively, may include two or more magnetic field sensing elements arranged in various configurations, e.g., a half bridge or full (Wheatstone) bridge. Depending on the device type and other application requirements, the magnetic field sensing element may be a device made of a type IV semiconductor material such as Silicon (Si) or Germanium (Ge), or a type III-V semiconductor material like Gallium-Arsenide (GaAs) or an Indium compound, e.g., Indium-Antimonide (InSb).

As is known, some of the above-described magnetic field sensing elements tend to have an axis of maximum sensitivity parallel to a substrate that supports the magnetic field sensing element, and others of the above-described magnetic field sensing elements tend to have an axis of maximum sensitivity perpendicular to a substrate that supports the magnetic field sensing element. In particular, planar Hall elements tend to have axes of sensitivity perpendicular to a substrate, while metal based or metallic magnetoresistance elements (e.g., GMR, TMR, AMR, spin-valve), fluxgate and vertical Hall elements tend to have axes of sensitivity parallel to a substrate.

It will be appreciated by those of ordinary skill in the art that while a substrate (e.g. a semiconductor substrate) is described as "supporting" the magnetic field sensing element, the element may be disposed "over" or "on" the active semiconductor surface, or may be formed "in" or "as part of" the semiconductor substrate, depending upon the type of magnetic field sensing element. For simplicity of explanation, while the embodiments described herein may utilize any suitable type of magnetic field sensing elements, such elements will be described here as being supported by the substrate.

As used herein, the term "magnetic field sensor" is used to describe a circuit that uses a magnetic field sensing element, generally in combination with other circuits. Magnetic field sensors are used in a variety of applications, including, but not limited to, an angle sensor that senses an angle of a direction of a magnetic field, a current sensor that senses a magnetic field generated by a current carried by a current-carrying conductor, a magnetic switch that senses the proximity of a ferromagnetic object, a rotation detector that senses passing ferromagnetic articles, for example, magnetic domains of a ring magnet or a ferromagnetic target (e.g., gear teeth) where the magnetic field sensor may be used in combination with a back-biased or other magnet, and a magnetic field sensor that senses a magnetic field density of a magnetic field.

As used herein, the term "target" is used to describe an object to be sensed or detected by a magnetic field sensor or magnetic field sensing element. A target may be ferromagnetic or magnetic.

As used in this application, the word "exemplary" is used herein to mean serving as an example, instance, or illustration. Any aspect or design described herein as "exemplary" is not necessarily to be construed as preferred or advantageous over other aspects or designs. Rather, use of the word exemplary is intended to present concepts in a concrete fashion.

Additionally, the term "or" is intended to mean an inclusive "or" rather than an exclusive "or". That is, unless specified otherwise, or clear from context, "X employs A or B" is intended to mean any of the natural inclusive permutations. That is, if X employs A; X employs B; or X employs both A and B, then "X employs A or B" is satisfied under any of the foregoing instances. In addition, the articles "a" and "an" as used in this application and the appended claims should generally be construed to mean "one or more" unless specified otherwise or clear from context to be directed to a singular form.

To the extent directional terms are used in the specification and claims (e.g., upper, lower, parallel, perpendicular, etc.), these terms are merely intended to assist in describing and claiming the invention and are not intended to limit the claims in any way. Such terms, do not require exactness (e.g., exact perpendicularity or exact parallelism, etc.), but instead it is intended that normal tolerances and ranges apply. Similarly, unless explicitly stated otherwise, each numerical value and range should be interpreted as being approximate as if the word "about", "substantially" or "approximately" preceded the value of the value or range.

Moreover, the terms "system," "component," "module," "interface,", "model" or the like are generally intended to refer to a computer-related entity, either hardware, a combination of hardware and software, software, or software in execution. For example, a component may be, but is not limited to being, a process running on a processor, a processor, an object, an executable, a thread of execution, a program, and/or a computer. By way of illustration, both an application running on a controller and the controller can be a component. One or more components may reside within a process and/or thread of execution and a component may be localized on one computer and/or distributed between two or more computers.

Although the subject matter described herein may be described in the context of illustrative implementations to process one or more computing application features/operations for a computing application having user-interactive components the subject matter is not limited to these particular embodiments. Rather, the techniques described herein can be applied to any suitable type of user-interactive component execution management methods, systems, platforms, and/or apparatus.

While the exemplary embodiments have been described with respect to processes of circuits, including possible implementation as a single integrated circuit, a multi-chip module, a single card, or a multi-card circuit pack, the described embodiments are not so limited. As would be apparent to one skilled in the art, various functions of circuit elements may also be implemented as processing blocks in a software program. Such software may be employed in, for example, a digital signal processor, micro-controller, or general-purpose computer.

Some embodiments might be implemented in the form of methods and apparatuses for practicing those methods. Described embodiments might also be implemented in the form of program code embodied in tangible media, such as magnetic recording media, optical recording media, solid state memory, floppy diskettes, CD-ROMs, hard drives, or any other machine-readable storage medium, wherein, when the program code is loaded into and executed by a machine, such as a computer, the machine becomes an apparatus for practicing the claimed invention. Described embodiments might also be implemented in the form of program code, for example, whether stored in a storage medium, loaded into and/or executed by a machine, or transmitted over some transmission medium or carrier, such as over electrical wiring or cabling, through fiber optics, or via electromagnetic radiation, wherein, when the program code is loaded into and executed by a machine, such as a computer, the machine becomes an apparatus for practicing the claimed invention. When implemented on a general-purpose processor, the program code segments combine with the processor to provide a unique device that operates analogously to specific logic circuits. Described embodiments might also be implemented in the form of a bitstream or other sequence of signal values electrically or optically transmitted through a medium, stored magnetic-field variations in a magnetic recording medium, etc., generated using a method and/or an apparatus of the claimed invention.

It should be understood that the steps of the exemplary methods set forth herein are not necessarily required to be performed in the order described, and the order of the steps of such methods should be understood to be merely exemplary. Likewise, additional steps may be included in such methods, and certain steps may be omitted or combined, in methods consistent with various embodiments.

Also, for purposes of this description, the terms "couple," "coupling," "coupled," "connect," "connecting," or "connected" refer to any manner known in the art or later developed in which energy is allowed to be transferred between two or more elements, and the interposition of one or more additional elements is contemplated, although not required. Conversely, the terms "directly coupled," "directly connected," etc., imply the absence of such additional elements.

As used herein in reference to an element and a standard, the term "compatible" means that the element communicates with other elements in a manner wholly or partially specified by the standard, and would be recognized by other elements as sufficiently capable of communicating with the other elements in the manner specified by the standard. The compatible element does not need to operate internally in a manner specified by the standard.

It will be further understood that various changes in the details, materials, and arrangements of the parts which have been described and illustrated in order to explain the nature of the claimed invention might be made by those skilled in the art without departing from the scope of the following claims.

The invention claimed is:

1. A system, comprising:
a first sensor including a sensing element $SE_{A1}$ and a sensing element $SE_{B1}$, the sensing elements $SE_{A1}$ and $SE_{B1}$ having respective axes of sensitivity that are substantially perpendicular to each other, the sensing element $SE_{A1}$ being arranged to generate a signal $S_{A1}$, the sensing element $SE_{B1}$ being arranged to generate a signal $S_{B1}$, the signals $S_{A1}$ and $S_{B1}$ being generated in response to a magnetic field that is associated with a rotating target;
a second sensor including a sensing element $SE_{A2}$ and a sensing element $SE_{B2}$, the sensing elements $SE_{A2}$ and $SE_{B2}$ having respective axes of sensitivity that are substantially perpendicular to each other, the sensing element $SE_{A2}$ being arranged to generate a signal $S_{A2}$, the sensing element $SE_{B2}$ being arranged to generate a signal $S_{B2}$, the signals $S_{A2}$ and $S_{B2}$ being generated in response to the magnetic field; and
a controller configured to obtain a position of the rotating target, the position being calculated based on a first difference between the signals SAI and $S_{A2}$ and a second difference between the signals $S_{B1}$ and $S_{B2}$,
wherein the first sensor is aligned with a first axis that intersects an axis of rotation of the rotating target, and the second sensor is aligned with a second axis that intersects the axis of rotation of the rotating target, the second axis being substantially perpendicular to the first axis, and
wherein the respective axes of sensitivity of sensing elements $SE_{A1}$ and $SE_{A2}$ have substantially the same orientation relative to an axis of a spatial reference frame where the first sensor the second sensor are situated, and the respective axes of sensitivity of sensing elements $SE_{B1}$ and $SE_{B2}$ have substantially the same orientation relative to the axis.

2. The system of claim 1, wherein the first sensor and the second sensor are substantially equidistant from the rotating target.

3. The system of claim 1, wherein the controller is integrated into one of the first sensor and the second sensor.

4. The system of claim 1, wherein the position of the rotating target is calculated in accordance with the equation of $$\delta c = \arctan\left(\frac{(S_{A1} - S_{A2})}{(S_{B1} - S_{B2})}\right),$$

where δc is the position of the rotating target.

5. The system of claim 1, wherein the controller is configured to receive the signals $S_{A1}$, $S_{B1}$, $S_{A2}$, and $S_{B2}$ and calculate the position of the rotating target based on the first difference between signals $S_{A1}$ and $S_{A2}$ and the second difference between signals $S_{B1}$ and $S_{B2}$.

6. The system of claim 1, wherein the first sensor is configured to receive the signals $S_{A2}$ and $S_{B2}$ from the second sensor, calculate a first indication of the position of the rotating target based on the first difference between signals $S_{A1}$ and $S_{A2}$ and the second difference between signals $S_{B1}$ and $S_{B2}$, and provide the first indication of the position of the rotating target to the controller.

7. The system of claim 6, wherein the second sensor is configured to receive the signals $S_{A1}$ and $S_{B1}$ from the first sensor, calculate a second indication of a position of the rotating target based on the first difference between the signals $S_{A1}$ and $S_{A2}$ and the second difference between the signals $S_{B1}$ and $S_{B2}$, and provide the second indication of the position of the rotating target to the controller.

8. The system of claim 7, wherein the controller is further configured to:
detect whether the first indication of the position of the rotating target is in agreement with the second indication of the position of the rotating target;
generate an output signal based on at least one of the first indication and the second indication when the first indication is in agreement with the second indication; and
generate a fault signal when the first indication of the position is not in agreement with the second indication.

9. The system of claim 7, wherein:
the first sensor is further configured to generate a third indication of the position of the rotating target based only on signals $S_{A1}$ and $S_{B1}$, and provide the third indication of the position of the rotating target to the controller;
the second sensor is further configured to generate a fourth indication of the position of the rotating target based only on signals $S_{A2}$ and $S_{B2}$, and provide the fourth indication of the position of the rotating target to the controller; and
the controller is configured to detect whether the first, second, third and fourth indications of the position of the rotating target are in agreement, and generate an output signal when the first, second, third, and fourth indications of the position are in agreement, the output signal being generated based on at least one of the first and second indications of the position of the rotating target.

10. The system of claim 9, wherein, when the first, second, third, and fourth indications of the position of the rotating target are not in agreement, the controller is further configured to identify one of the first sensor and the second sensor as having failed, and transition into a state in which the output signal is generated based only on data that is received from the other one of the first sensor and the second sensor.

11. The system of claim 1, wherein:
the first sensor is further configured to: receive the signals $S_{A2}$ and $S_{B2}$ from the second sensor, calculate the first difference between signals $S_{A1}$ and $S_{A2}$, calculate the second difference between signals $S_{B1}$ and $S_{B2}$, and provide the first difference and the second difference to the controller; and
the controller is further configured to: calculate the position of the rotating target based on the first difference and the second difference.

12. The system of claim 1, wherein:
the first sensor is further configured to: receive the signals $S_{A2}$ and $S_{B2}$ from the second sensor, calculate a first indication Si of the first difference between the signals $S_{B1}$ and $S_{B2}$, calculate a first indication $C_1$ of the second difference between signals $S_{A1}$ and $S_{A2}$, and provide $S_1$ and $C_1$ to the controller; and the second sensor is further configured to: receive the signals $S_{B1}$ and $S_{B2}$ from the first sensor, calculate a second indication $S_2$ of the first difference between the signals $S_{A1}$ and $S_{A2}$, calculate a second indication $C_2$ of the second difference between signals $S_{A1}$ and $S_{A2}$, and provide $S_2$ and $C_2$ to the controller.

13. The system of claim 12, wherein the controller is further configured to:
detect whether the indications $S_1$ and $S_2$ are in agreement with each other;
detect whether the indications $C_1$ and $C_2$ are in agreement with each other; and
calculate the position of the rotating target when $S_1$ is in agreement with $S_2$ and $C_1$ is in agreement with $C_2$.

14. The system of claim 13, wherein, when $S_1$ is not in agreement with $S_2$, or when $C_1$ is not in agreement with $C_2$, the controller is further configured to generate a fault signal, identify one of the first sensor and the second sensor as having failed, and transition into a state in which only data generated by the other one of the first sensor and the second sensor is used to obtain the position of the rotating target.

15. The system of claim 1, wherein, the first sensor and the second sensor are implemented by using different magnetic field sensing technologies.

16. The system of claim 1, wherein each of the sensing elements $SE_{A1}$, $SE_{B1}$, $SE_{A2}$, and $SE_{B2}$ includes at least one of a giant magnetoresistor (GMR), a tunnel magnetoresistor (TMR), an anisotropic magneto resistor (AMR), a Hall plate, or a fluxgate, and wherein the first sensor is situated directly above or below the rotating target.

17. A method, comprising:
generating signals $S_{A1}$ and $S_{B1}$ by using a first sensor that is positioned at a first position relative to a rotating target, the signals $S_{A1}$ and $S_{B1}$ being generated in response to a magnetic field that is associated with the rotating target, the signal $S_{A1}$ being indicative of a magnitude, at the first position, of a component of the magnetic field in a first direction, and the signal $S_{B1}$ being indicative of a magnitude, at the first position, of a component of the magnetic field in a second direction, the second direction being substantially perpendicular to the first direction;
generating signals $S_{A2}$ and $S_{B2}$ by using a second sensor that is positioned at a second position relative to the rotating target, the signals $S_{A2}$ and $S_{B2}$ being generated in response to the magnetic field, the signal $S_{A2}$ being indicative of a magnitude, at the second position, of the component of the magnetic field in the first direction, and the signal $S_{B2}$ being indicative of a magnitude, at the second position, of the component of the magnetic field in the second direction; and
calculating a position of the rotating target based a first difference between the signals $S_{A1}$ and $S_{A2}$ and a second difference between the signals $S_{B1}$ and $S_{B2}$,
wherein the signal $S_{A1}$ is generated by a sensing element $SE_{A1}$, the signal $S_{A2}$ is generated by a sensing element $SE_{A2}$, the signal $S_{B1}$ is generated by a sensing element $SE_{B1}$, and the signal $S_{B2}$ is generated by a sensing element $S_{B2}$, sensing elements $SE_{A1}$ and $SE_{B1}$ being part of the first sensor, and sensing elements $SE_{A2}$ and $SE_{B2}$ being part of the second sensor,
wherein the first sensor is aligned with first axis that intersects an axis of rotation of the rotating target, and the second sensor is aligned with a second axis that intersects the axis of rotation of the rotating target, the second axis being substantially perpendicular to the first axis, wherein respective axes of sensitivity of sensing elements $SE_{A1}$ and $SE_{A2}$ have substantially the same orientation relative to an axis of a spatial reference frame where the first sensor and the second sensor are situated, and wherein respective axes of sensitivity of sensing elements $SE_{B1}$ and $SE_{B2}$ have substantially the same orientation relative to the axis.

18. The method of claim 17, wherein the first position and the second position are equidistant from an axis of rotation of the rotating target.

19. The method of claim 17, wherein the first position is located on the first axis and the second position is located on the second axis.

20. The method of claim 17, wherein the first position and the second position are equidistant from an axis of rotation of the rotating target.

21. The method of claim 17, wherein:
the axes of sensitivity of sensing elements $SE_{A1}$ and $SE_{B1}$ are substantially perpendicular, and
the axes of sensitivity of sensing elements $SE_{A2}$ and $SE_{B2}$ are substantially perpendicular.

22. The method claim 17, wherein the first position is situated directly above or below the rotating target.

23. The method of claim 17, wherein the first position is situated to a side of the rotating target.

24. The method of claim 17, wherein each of sensing elements $SE_{A1}$, $SE_{B1}$, $SE_{A2}$, and $SE_{B2}$ includes at least one of a giant magnetoresistor (GMR), a tunnel magnetoresistor (TMR), a Hall plate, or a fluxgate.

25. The method of claim 17, wherein the position of the rotating target is calculated in accordance with the equation of $$\delta c = \arctan\left(\frac{(S_{A1} - S_{A2})}{(S_{B1} - S_{B2})}\right).$$

where $\delta_c$ is the position of the rotating target.

26. The method of claim 17, wherein the position of the rotating target is calculated, at least in part, by one of the first sensor and the second sensor.

27. The method of claim 17, wherein the position of the rotating target is calculated, at least in part, by a controller that is operatively coupled to at least one of the first sensor and the second sensor.

* * * * *